(12) United States Patent
Shimbori

(10) Patent No.: US 12,296,403 B2
(45) Date of Patent: May 13, 2025

(54) LASER PROCESSING APPARATUS AND METHOD FOR PROCESSING WORKPIECE

(71) Applicant: Gigaphoton Inc., Tochigi (JP)

(72) Inventor: Masashi Shimbori, Oyama (JP)

(73) Assignee: Gigaphoton Inc., Tochigi (JP)

( * ) Notice: Subject to any disclaimer, the term of this patent is extended or adjusted under 35 U.S.C. 154(b) by 878 days.

(21) Appl. No.: 17/341,554

(22) Filed: Jun. 8, 2021

(65) Prior Publication Data

US 2021/0291297 A1    Sep. 23, 2021

Related U.S. Application Data

(63) Continuation of application No. PCT/JP2019/001971, filed on Jan. 23, 2019.

(51) Int. Cl.
*B23K 26/066* (2014.01)
*B23K 26/06* (2006.01)
*B23K 26/073* (2014.01)
*B23K 26/082* (2014.01)

(52) U.S. Cl.
CPC ........ *B23K 26/066* (2015.10); *B23K 26/0643* (2013.01); *B23K 26/0648* (2013.01);
(Continued)

(58) Field of Classification Search
CPC .............. B23K 26/066; B23K 26/0643; B23K 26/0648; B23K 26/0665; B23K 26/0732;
(Continued)

(56) References Cited

U.S. PATENT DOCUMENTS 6,285,855 B1    9/2001   Tsuji
2004/0005744 A1*  1/2004  Taniguchi .......... H01L 21/02691
                                                           438/166
(Continued)

FOREIGN PATENT DOCUMENTS

JP       S63-052786 A       3/1988
JP       S6352786 A    *    3/1988
(Continued)

OTHER PUBLICATIONS

International Search Report issued in PCT/JP2019/001971; mailed Mar. 12, 2019.
(Continued)

*Primary Examiner* — Dana Ross
*Assistant Examiner* — Adam M Eckardt
(74) *Attorney, Agent, or Firm* — Studebaker Brackett PLLC

(57) ABSTRACT

A laser processing apparatus includes a placement base on which a workpiece is placed, a beam shaping optical system configured to shape laser light in such a way that a laser light irradiated region of a mask configured to block part of the laser light has a rectangular shape having short edges and long edges, a second radiation width of the irradiated region in the direction parallel to the long edges being changeable independently of a first radiation width of the irradiated region in the direction parallel to the short edges, and the irradiated region being movable in the direction parallel to the long edges, a projection optical system configured to project a pattern of the mask on the workpiece placed on the placement base, and a mover configured to be capable of moving the irradiated region in the direction parallel to the short edges.

18 Claims, 11 Drawing Sheets

(52) U.S. Cl.
 CPC ...... *B23K 26/0665* (2013.01); *B23K 26/0732* (2013.01); *B23K 26/082* (2015.10)

(58) Field of Classification Search
 CPC .. B23K 26/082; B23K 26/0626; B23K 26/38; B23K 26/0622; B23K 26/06; B23K 26/073; H01S 3/00; H05K 3/00
 See application file for complete search history.

(56) References Cited

U.S. PATENT DOCUMENTS

| | | | |
|---|---|---|---|
| 2004/0233411 A1* | 11/2004 | Shiraishi | G03F 7/70858 |
| | | | 250/548 |
| 2010/0027570 A1 | 2/2010 | Lizotte et al. | |
| 2010/0284201 A1* | 11/2010 | Alasaarela | G02B 27/0994 |
| | | | 362/551 |
| 2011/0228537 A1 | 9/2011 | Yoshimizu et al. | |
| 2019/0283179 A1 | 9/2019 | Kakizaki et al. | |
| 2020/0251359 A1* | 8/2020 | Wakabayashi | C23C 14/48 |

FOREIGN PATENT DOCUMENTS

| | | | | |
|---|---|---|---|---|
| JP | H04-238686 A | | 8/1992 | |
| JP | H06-177009 A | | 6/1994 | |
| JP | H10-270312 A | | 10/1998 | |
| JP | 2002-207167 A | | 7/2002 | |
| JP | 2007273539 A | * | 10/2007 | ......... B23K 26/0622 |
| JP | 2010-067794 A | | 3/2010 | |
| JP | 2011-216863 A | | 10/2011 | |
| JP | 6352786 B2 | * | 7/2018 | |
| WO | WO-2014156818 A1 | * | 10/2014 | ......... B23K 26/0006 |
| WO | WO-2017109928 A1 | * | 6/2017 | ......... B23K 26/0006 |
| WO | 2018/100638 A1 | | 6/2018 | |

OTHER PUBLICATIONS

International Preliminary Report on Patentability and Written Opinion of the International Searching Authority issued in PCT/JP2019/001971; issued Jul. 27, 2021.

* cited by examiner

LASER PROCESSING APPARATUS AND METHOD FOR PROCESSING WORKPIECE

CROSS-REFERENCE TO RELATED APPLICATIONS

The present application is a continuation application of International Application No. PCT/JP2019/001971, filed on Jan. 23, 2019, the entire contents of which are hereby incorporated by reference.

BACKGROUND

1. Technical Field

The present disclosure relates to a laser processing apparatus and a method for processing a workpiece.

2. Related Art

In recent years, a semiconductor exposure apparatus (hereinafter referred to as "exposure apparatus") is required to improve the resolution thereof as a semiconductor integrated circuit is increasingly miniaturized and highly integrated. To this end, reduction in the wavelength of the light outputted from a light source for exposure is underway. A gas laser apparatus is generally used as the light source for exposure in place of a mercury lamp in related art. For example, a KrF excimer laser apparatus, which outputs ultraviolet laser light having a wavelength of 248 nm, and an ArF excimer laser apparatus, which outputs ultraviolet laser light having a wavelength of 193 nm, are used as the gas laser apparatus for exposure.

Excimer laser light, which has a pulse width of about several tens of nanoseconds and has the short wavelength of 248.4 nm or 193.4 nm, is used in some cases to directly process a polymer material, a glass material, and other materials.

The excimer laser light having photon energy higher than chemical binding energy of a polymer material can unbind the chemically bonded molecules that form the polymer material. Unheated processing can therefore be performed on a polymer material by using the excimer laser light, and it is known that an excellent processed shape is achieved by the unheated processing.

Glass, ceramic, and other materials absorb the excimer laser light by a large amount, and it is therefore known that the excimer laser light can process a material difficult to process with visible or infrared laser light.

CITATION LIST

Patent Literature

[PTL 1] JP-A-2010-067794
[PTL 2] JP-A-2007-273539

SUMMARY

A laser processing apparatus according to a viewpoint of the present disclosure includes a placement base on which a workpiece is placed, a beam shaping optical system configured to shape laser light in such a way that an irradiated region of a mask configured to block part of the laser light that is a region irradiated with the laser light has a rectangular shape having short edges and long edges, a second radiation width of the irradiated region in a direction parallel to the long edges being changeable independently of a first radiation width of the irradiated region in a direction parallel to the short edges, and the irradiated region being movable in the direction parallel to the long edges, a projection optical system configured to project a pattern of the mask on the workpiece placed on the placement base, and a mover configured to be capable of moving the irradiated region in the direction parallel to the short edges.

A method for processing a workpiece according to another viewpoint of the present disclosure uses a laser processing apparatus including a placement base on which a workpiece is placed, a beam shaping optical system configured to shape laser light in such a way that an irradiated region of a mask configured to block part of the laser light that is a region irradiated with the laser light has a rectangular shape having short edges and long edges, a second radiation width of the irradiated region in a direction parallel to the long edges being changeable independently of a first radiation width of the irradiated region in a direction parallel to the short edges, and the irradiated region being movable in the direction parallel to the long edges, a projection optical system configured to project a pattern of the mask on the workpiece placed on the placement base, and a mover configured to be capable of moving the irradiated region in the direction parallel to the short edges, the method including shaping the laser light in such a way that the irradiated region has the rectangular shape, projecting the pattern of the mask on the workpiece placed on the placement base, and moving the irradiated region in the direction parallel to the short edges.

BRIEF DESCRIPTION OF THE DRAWINGS

An embodiment of the present disclosure will be described below only by way of example with reference to the accompanying drawings.

DETAILED DESCRIPTION

Figure 1:
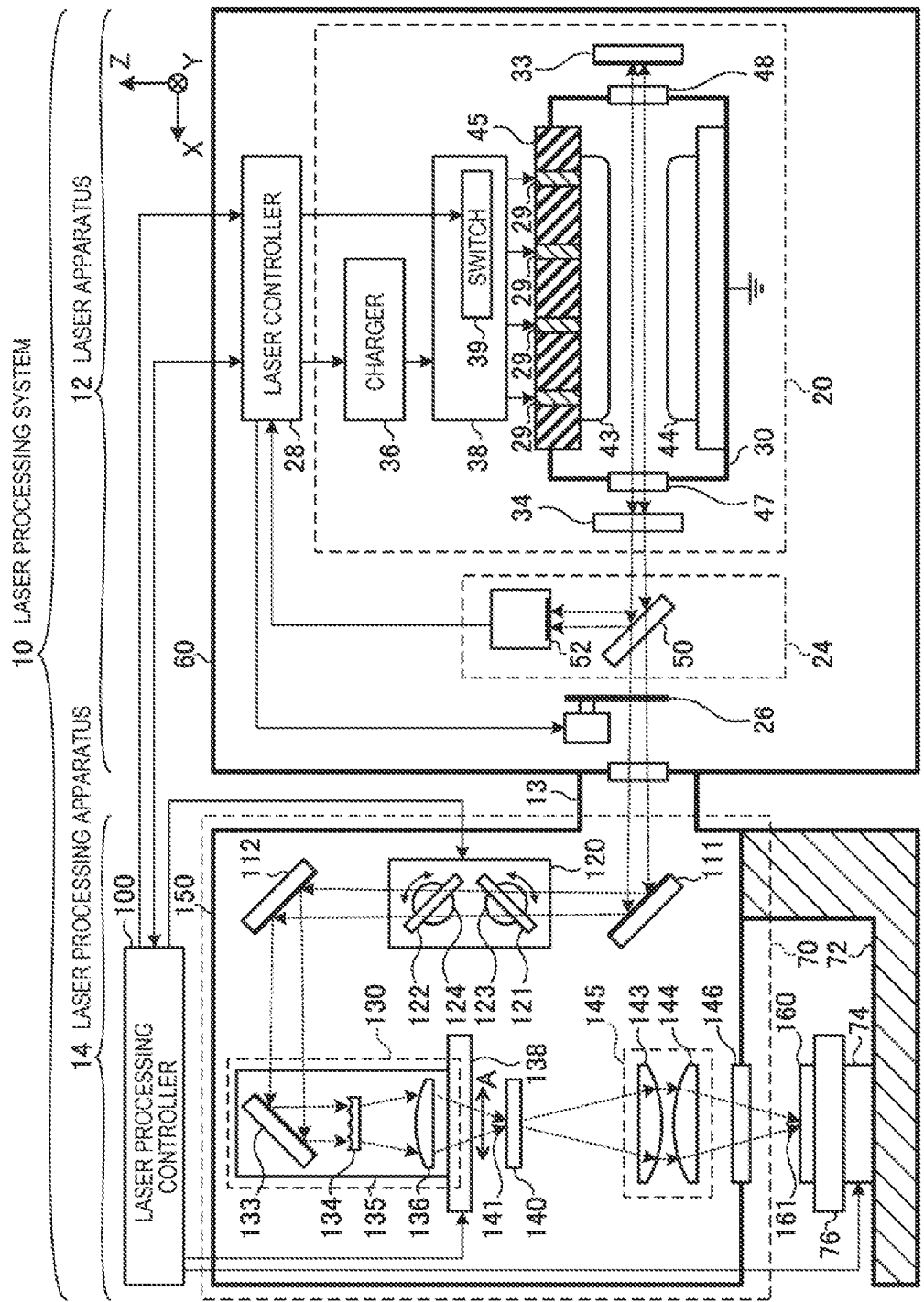
FIG. 1 schematically shows the configuration of a laser processing system 10 including a laser processing apparatus 14 according to Comparative Example.

<Contents>
1. Laser processing apparatus and laser processing system according to Comparative Example
    1.1 Configuration
        1.1.1 Configuration of laser apparatus
        1.1.2 Configuration of laser processing apparatus
    1.2 Operation
        1.2.1 Operation of laser apparatus
        1.2.2 Operation of laser processing apparatus
        1.2.3 Movement of irradiated region of mask
        1.2.4 Movement of irradiated region of workpiece
        1.2.5 Operation of laser processing controller
            1.2.5.1 Main procedure
            1.2.5.2 Details of reading of laser processing condition parameters
            1.2.5.3 Details of calculation and setting of control parameters
            1.2.5.4 Details of beam scan processing
    1.3 Problems
2. Laser processing apparatus capable of changing radiation width and irradiated region
    2.1 Configuration
        2.1.1 Configuration of beam shaping optical system
        2.1.2 Configuration of uniaxial stage
    2.2 Operation
        2.2.1 Movement of irradiated region of mask
            2.2.1.1 First state
            2.2.1.2 Second state
        2.2.2 Movement of irradiated region of workpiece
        2.2.3 Operation of laser processing controller
            2.2.3.1 Reading of laser processing condition parameters
            2.2.3.2 Calculation and setting of control parameters
            2.2.3.3 Beam scan processing
    2.3 Effects
3. Others The embodiment of the present disclosure will be described below in detail with reference to the drawings. The embodiment described below show an example of the present disclosure and is not intended to limit the contents of the present disclosure. Further, all configurations and operations described in the present embodiment are not necessarily essential as configurations and operations in the present disclosure. The same component has the same reference character, and no redundant description of the same component will be made.

1. Laser Processing Apparatus and Laser Processing System According to Comparative Example 1.1 Configuration FIG. 1 schematically shows the configuration of a laser processing system 10 including a laser processing apparatus 14 according to Comparative Example. The laser processing system 10 includes a laser apparatus 12, an optical path tube 13, and the laser processing apparatus 14.

1.1.1 Configuration of Laser Apparatus

The laser apparatus 12 is a laser apparatus configured to output ultraviolet laser light. For example, the laser apparatus 12 may be a discharge-excitation-type laser apparatus containing $F_2$, ArF, KrF, XeCl, or XeF as the laser medium. The laser apparatus 12 includes an oscillator 20, a monitor module 24, a shutter 26, and a laser controller 28.

The oscillator 20 includes a chamber 30, a rear mirror 33, an output coupling mirror 34, a charger 36, and a pulse power module (PPM) 38. The chamber 30 encapsulates an excimer laser gas.

The chamber 30 includes a pair of electrodes 43 and 44, an insulating member 45, and windows 47 and 48. A plurality of conductive members 29 are buried in the insulating member 45. The electrode 43 is supported by the insulating member 45. The electrode 43 is electrically connected to the pulse power module 38 via the conductive members 29. The electrode 44 is connected to ground potential via a conductive member that forms the chamber 30.

The rear mirror 33 and the output coupling mirror 34 form an optical resonator. The rear mirror 33 is formed of a flat substrate coated with a high-reflectance film, and the output coupling mirror 34 is formed of a flat substrate coated with a partial reflection film. The chamber 30 is disposed in the optical path of the optical resonator.

The monitor module 24 includes a beam splitter 50 and an optical sensor 52.

The shutter 26 is disposed in the optical path of the laser light having passed through the beam splitter 50.

The optical path of the laser light may be encapsulated by an enclosure 60 and the optical path tube 13 and may be purged with an $N_2$ gas.

1.1.2 Configuration of Laser Processing Apparatus

The laser processing apparatus 14 includes a radiation optical system 70, a frame 72, an XYZ stage 74, and a laser processing controller 100.

The radiation optical system 70 and the XYZ stage 74 are fixed to the frame 72. A workpiece 160 is supported by a table 76 on the XYZ stage 74. The table 76 is an example of a placement base on which the workpiece 160 is placed.

The workpiece 160 may, for example, be an interposer substrate configured to relay an LSI (large-scale integrated circuit) chip to a primary printed board or a flexible printed board. An insulating material of which such a substrate is made is, for example, a polymer material, a glass epoxy material, or a glass material.

The radiation optical system 70 includes high-reflectance mirrors 111 and 112, an attenuator 120, a beam shaping optical system 130, a uniaxial stage 138, a mask 140, a projection optical system 145, a window 146, and an enclosure 150.

The high-reflectance mirror 111 is disposed in the optical path of the laser light having passed through the optical path tube 13. The high-reflectance mirror 111 is so disposed that the laser light passes through the attenuator 120 and is incident on the high-reflectance mirror 112.

The attenuator 120 is disposed in the optical path between the high-reflectance mirror 111 and the high-reflectance mirror 112. The attenuator 120 includes two partial reflection mirrors 121 and 122 and rotary stages 123 and 124. The rotary stages 123 and 124 are configured to be capable of changing the angles of incidence of the laser light incident on the partial reflection mirrors 121 and 122, respectively.

The high-reflectance mirror 112 is so disposed that the laser light having passed through the attenuator 120 enters the beam shaping optical system 130.

The beam shaping optical system 130 includes a high-reflectance mirror 133, a fly-eye lens 134, and a condenser lens 136.

The high-reflectance mirror 133 provided in the beam shaping optical system 130 is so disposed that the laser light incident on the high-reflectance mirror 133 enters the fly-eye lens 134.

The fly-eye lens 134 is so disposed that the focal plane of the fly-eye lens 134 coincides with the front focal plane of the condenser lens 136. The condenser lens 136 is so disposed that the rear focal plane of the condenser lens 136 coincides with the position of the mask 140.

The beam shaping optical system 130 having the configuration described above provides the mask 140 with Koehler illumination.

Figure 2A:
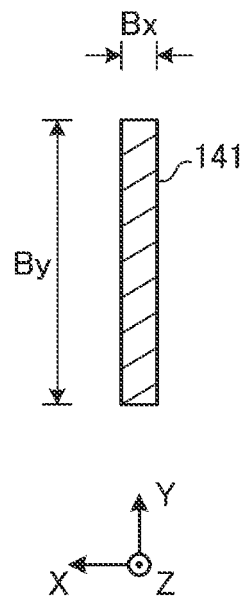
FIG. 2A shows an example of a laser light irradiated region 141 of a mask 140.

FIG. 2A shows an example of a laser light irradiated region 141 of the mask 140. The irradiated region 141 corresponds to a cross section of the optical path of the laser light taken along the surface of the mask 140. The irradiated region 141 has a rectangular shape. The rectangular shape has short edges and long edges. The direction parallel to the short edges of the rectangular irradiated region 141 is called an X-axis direction, and the direction parallel to the long edges of the rectangular irradiated region 141 is called a Y-axis direction. Let Bx be a radiation width in the direction parallel to the short edges, and let By be a radiation width in the direction parallel to the long edges.

Referring to FIG. 1 again, the beam shaping optical system 130 is accommodated in an enclosure 135. The enclosure 135 is so supported by the uniaxial stage 138 as to be movable along with the beam shaping optical system 130 in the X-axis direction indicated by a bidirectional arrow A. When the beam shaping optical system 130 moves in the X-axis direction, the irradiated region 141 moves in the X-axis direction on the mask 140.

The mask 140 is, for example, a mask formed of a synthetic quartz substrate which transmits the excimer laser light, which is ultraviolet light, and on which a pattern formed of a metal or dielectric multilayer film is formed. For example, to form via holes in a printed board as the workpiece 160, a pattern having holes each having a diameter ranging from 5 to 30 μm is formed on the mask 140.

The projection optical system 145 is so disposed as to form an inverted image of the mask 140 on the surface of the workpiece 160. The projection optical system 145 may be a reduction projection optical system formed of a unit lens formed of a plurality of lenses 143 and 144.

The window 146 is disposed in the optical path of the laser light between the projection optical system 145 and the workpiece 160. The window 146 is disposed in a hole provided in the enclosure 150, for example, via an O ring that is not shown. The window 146 may be a substrate made of $CaF_2$ crystal or synthetic quartz, which transmits the excimer laser light, and may be coated with reflection suppression films on opposite sides.

The enclosure 150 may be so sealed, for example, with O rings that outside air does not enter the enclosure 150 and may be purged with an $N_2$ gas.

The laser processing controller 100 is configured to control the operation of the attenuator 120, the uniaxial stage 138, and the XYZ stage 74. The laser processing controller 100 is configured to transmit data on target pulse energy Et and output a light emission trigger to the laser apparatus 12.

1.2 Operation 1.2.1 Operation of Laser Apparatus

In the laser apparatus 12, the laser controller 28 is configured to transmit a charging voltage setting signal to the charger 36 based on the data on the target pulse energy Et received from the laser processing controller 100. The laser controller 28 is further configured to transmit a light emission trigger to a switch 39 provided in the pulse power module 38 based on the light emission trigger received from the laser processing controller 100.

The switch 39 of the pulse power module 38 is turned on upon reception of the light emission trigger from the laser controller 28. The pulse power module 38 is configured to generate pulsed high voltage from the electric energy charged in the charger 36 when the switch 39 is turned on. The pulse power module 38 is configured to apply the high voltage to the space between the pair of electrodes 43 and 44.

When the high voltage is applied to the space between the pair of electrodes 43 and 44, discharge occurs between the pair of electrodes 43 and 44. The discharge energy excites the laser gas in the chamber 30, and the state of the excited laser gas transitions to a high energy level. Thereafter, when the excited laser gas transitions to a low energy level, the laser gas emits light having a wavelength according to the difference between the energy levels.

The light generated in the chamber 30 exits out of the chamber 30 via the windows 47 and 48. The light having exited via the window 48 of the chamber 30 is reflected off the rear mirror 33 at high reflectance and returns into the chamber 30.

The output coupling mirror 34 is configured to transmit and output part of the light having exited via the window 47 of the chamber 30 and reflect the remaining light back into the chamber 30.

The light having exited out of the chamber 30 thus travels back and forth between the rear mirror 33 and the output coupling mirror 34 and is amplified whenever passing through the discharge space between the pair of electrodes 43 and 44 to achieve laser oscillation. As a result, laser light exits via the output coupling mirror 34. The laser light is pulsed laser light.

The monitor module 24 is configured to detect the pulse energy of the laser light having exited via the output coupling mirror 34. The monitor module 24 is configured to transmit data on the detected pulse energy to the laser controller 28.

The laser controller 28 is configured to perform feedback control on the charging voltage to be set in the charger 36 based on the data on the measured pulse energy received from the monitor module 24 and the data on the target pulse energy Et received from the laser processing controller 100.

1.2.2 Operation of Laser Processing Apparatus

The XYZ stage 74 is configured to position the table 76 in such a way that the inverted image of the mask 140 is formed in a desired processing target region of the workpiece 160.

The laser light having passed through the beam splitter 50 of the monitor module 24 with the shutter 26 open enters the laser processing apparatus 14 through the optical path tube 13. The laser light is guided by the radiation optical system 70 to the workpiece 160 as follows.

The laser light having entered the laser processing apparatus 14 is reflected off the high-reflectance mirror 111, passes through the attenuator 120, and is then reflected off the high-reflectance mirror 112 in the X-axis direction.

The laser light reflected off the high-reflectance mirror 112 enters the beam shaping optical system 130, which spatially homogenizes the optical intensity distribution of the laser light and shapes the laser light into a rectangular beam having short and long edges. The laser light having exited out of the beam shaping optical system 130 is incident on the mask 140. As the beam shaping optical system 130 driven by the uniaxial stage 138 moves in the X-axis direction at a moving speed Vxm, the irradiated region 141 moves on the mask 140 in the X-axis direction at the moving speed Vxm.

Part of the laser light is blocked in accordance with the pattern formed on the mask 140, and the remaining laser light passes through the mask 140. The laser light having passed through the mask 140 is reduced in size and projected by the projection optical system 145 on the surface of the workpiece 160. A laser light irradiated region 161 of the workpiece 160 has the shape of a portion of the pattern formed on the mask 140 that is the portion corresponding to the irradiated region 141 and reduced by the projection optical system 145. The irradiated region 161 corresponds to the cross section of the optical path of the laser light taken along the surface of the workpiece 160. When the workpiece 160 is irradiated with the laser light, the surface of the workpiece 160 undergoes abrasion or laser processing.

As the laser light irradiated region 141 of the mask 140 is driven by the uniaxial stage 138 and moves in the X-axis direction at the moving speed Vxm, the laser light irradiated region 161 of the workpiece 160 moves on the workpiece 160 in the X-axis direction at a moving speed –M·Vxm. M represents the magnification factor of the projection optical system 145. Since the projection optical system 145 is a reduction projection optical system, M is a positive value smaller than one. M may, for example, be greater than or equal to ¼ but smaller than or equal to ½. The direction in which the irradiated region 141 driven by the uniaxial stage 138 moves is opposite the direction in which the irradiated region 161 moves. The radiation width in the direction parallel to the short edges of the irradiated region 161 is M·Bx, and the radiation width in the direction parallel to the long edges of the irradiated region 161 is M·By.

1.2.3 Movement of Irradiated Region of Mask

Figure 2B:
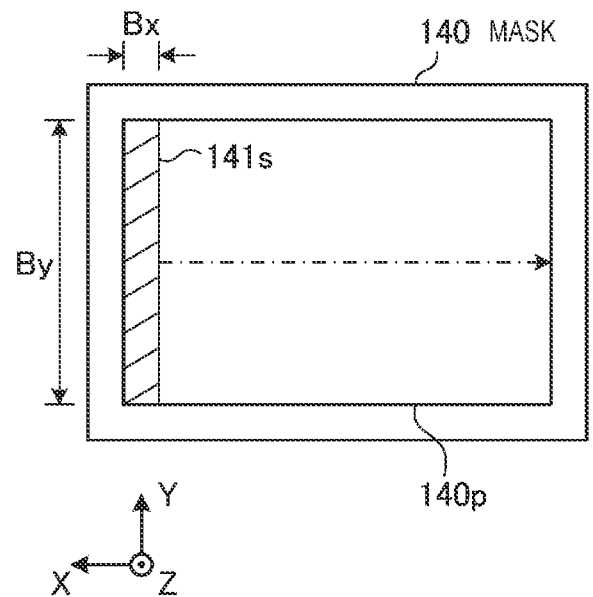
FIG. 2B is a plan view showing an example of the mask 140 irradiated with laser light in Comparative Example.

FIG. 2B is a plan view showing an example of the mask 140 irradiated with laser light in Comparative Example. The mask 140 has a patterned region 140p, in which a pattern is formed. The uniaxial stage 138 is driven to move the irradiated region 141 rightward from an initial position 141s located at the left end in FIG. 2B. The patterned region 140p is thus entirely irradiated with the laser light.

The uniaxial stage 138 is then driven in the opposite direction to move the irradiated region 141 leftward from the right end in FIG. 2B. The patterned region 140p is also in this case entirely irradiated with the laser light.

Switching the direction in which the uniaxial stage 138 is driven from one to the other as described above allows the patterned region 140p to be repeatedly irradiated with the laser light.

1.2.4 Movement of Irradiated Region of Workpiece

Figure 3:
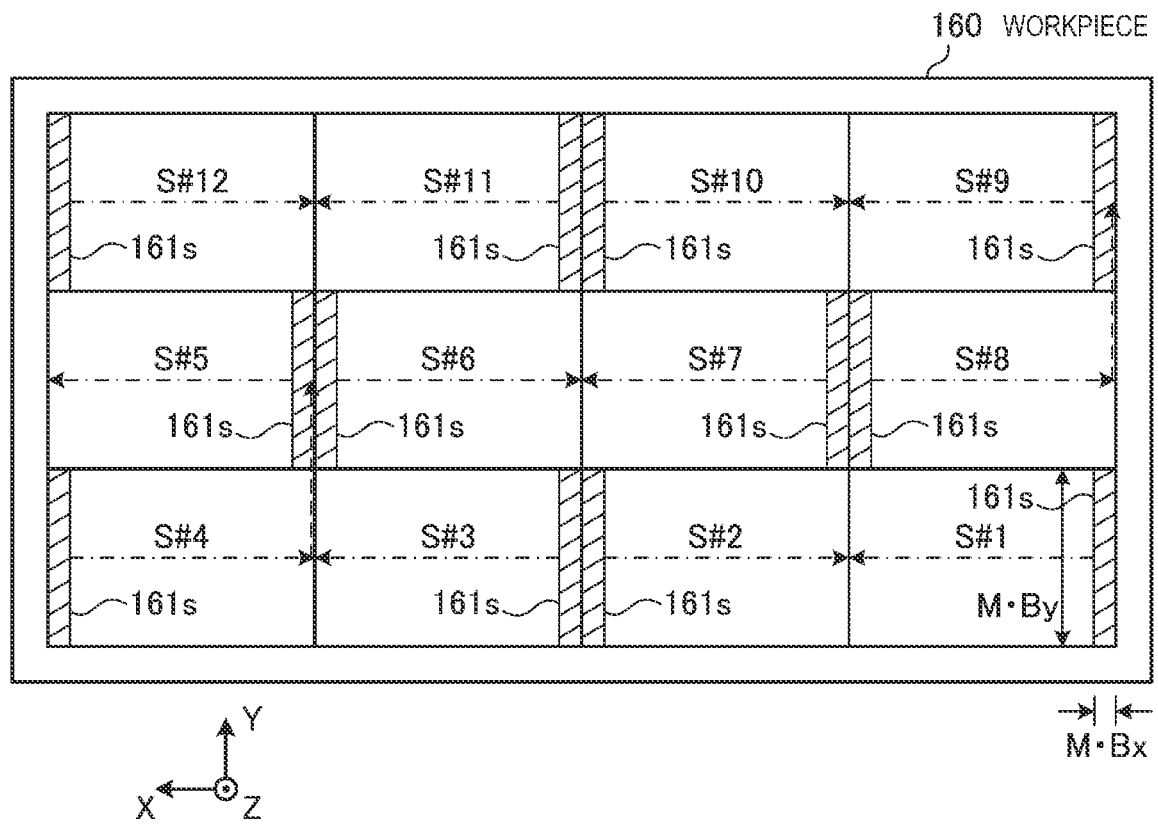
FIG. 3 is a plan view showing an example of a laser-beam-scan processing method for processing a workpiece 160.

FIG. 3 is a plan view showing an example of a laser-beam-scan processing method for processing the workpiece 160. In FIG. 3, the processed surface of the workpiece 160 is segmented into twelve processing target regions from "S #1" to "S #12." The order from the reference characters "S #1" to "S #12" corresponds to the order in accordance with which the workpiece 160 is processed in the beam scan scheme. The chain-line arrows represent the directions in which the irradiated regions 161 in the respective processing target regions move.

The XYZ stage 74 is first so operated as to move the workpiece 160 that the region where the inverted image of the mask 140 is formed coincides with the first processing target region S #1, and the XYZ stage 74 is then stopped. The mask 140 is then irradiated with the laser light, and the laser light irradiated region 141 of the mask 140 is moved by the uniaxial stage 138 rightward from the initial position 141s, which is located at the left end in FIG. 2B. The laser light irradiated region 161 of the workpiece 160 thus moves leftward from an initial position 161s located at the right end of the processing target region S #1 in FIG. 3. The beam scan action performed once completes the processing of the processing target region S #1.

When the beam scan action is completed in one processing target region, the radiation of the laser light is stopped.

The XYZ stage 74 is then so operated as to move the workpiece 160 that the region where the inverted image of the mask 140 is formed coincides with the following processing target region S #2, and the XYZ stage 74 is stopped. The mask 140 is then irradiated with the laser light, and the laser light irradiated region 141 of the mask 140 is moved by the uniaxial stage 138 leftward from the right end in FIG. 2B. The laser light irradiated region 161 of the workpiece 160 thus moves rightward from the initial position 161s located at the left end of the processing target region S #2 in FIG. 3. The processing of the processing target region S #2 is thus completed.

Operating the XYZ stage 74 in the X-axis or Y-axis direction as described above changes the region where the inverted image of the mask 140 is formed in the order of "S #1," "S #2," "S #3," . . . , "S #12." The direction in which the irradiated region 161 moves is reversed whenever the beam scan is performed on a processing target region basis and the region where the inverted image of the mask 140 is formed is changed. The laser processing is performed by the actions described above.

1.2.5 Operation of Laser Processing Controller 1.2.5.1 Main Procedure

Figure 4:
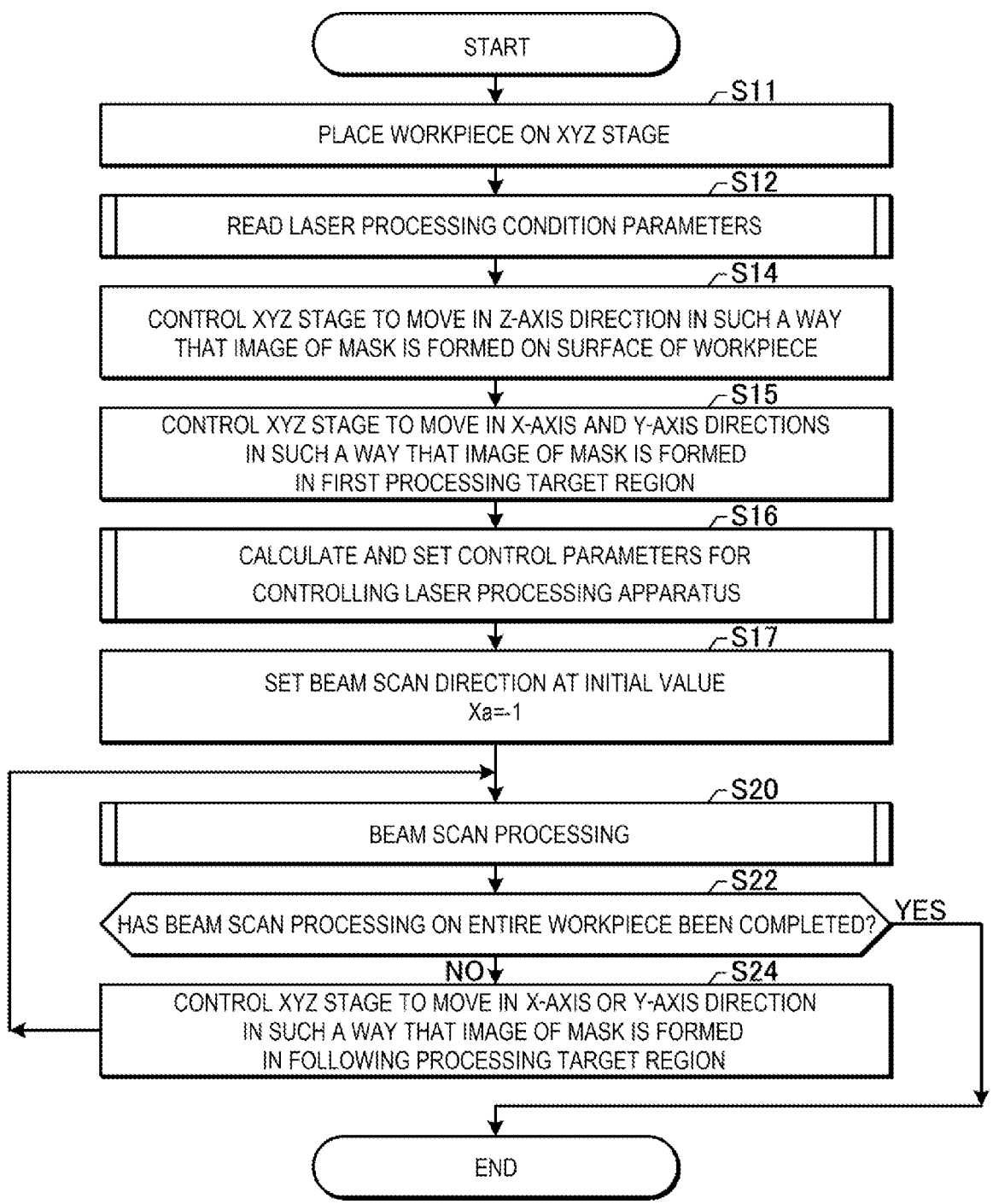
FIG. 4 is a flowchart showing the operation of a laser processing controller 100.

FIG. 4 is a flowchart showing the operation of the laser processing controller 100. The laser processing using the beam scan scheme is performed as follows.

In step S11, the workpiece 160 is placed on the table 76 on the XYZ stage 74. The workpiece 160 is placed on the table 76, for example, by a workpiece transfer robot or any other automatic transport apparatus that is not shown but is controlled by the laser processing controller 100.

In step S12, the laser processing controller 100 reads laser processing condition parameters. The laser processing condition parameters will be described later with reference to FIG. 5.

In step S14, the laser processing controller 100 controls the XYZ stage 74 in a Z-axis direction in such a way that the image of the mask 140 is formed on the surface of the workpiece 160.

In step S15, the laser processing controller 100 controls the XYZ stage 74 in the X-axis and Y-axis directions in such a way that the image of the mask 140 is formed in the first processing target region S #1 of the workpiece 160.

In step S16, the laser processing controller 100 calculates and sets control parameters for controlling the laser processing apparatus 14. The control parameters for controlling the laser processing apparatus 14 will be described later with reference to FIG. 6.

In step S17, the laser processing controller 100 sets the value of a parameter Xa, which represents the beam scan direction on the workpiece 160, at an initial value of −1.

In step S20, the laser processing controller 100 controls the beam scan processing. The laser processing controller 100 performs the beam scan action on one processing target region to process the processing target region. The beam scan processing will be described later with reference to FIG. 7.

In step S22, the laser processing controller 100 evaluates whether or not the beam scan processing on the entire workpiece 160 has been completed. When the result of the evaluation in step S22 is NO, the laser processing controller 100 proceeds to step S24.

In step S24, the laser processing controller 100 controls the XYZ stage 74 in the X-axis or Y-axis direction in such a way that the image of the mask 140 is formed in the following processing target region and then returns to step S20. The laser processing controller 100 repeats the processes in steps S20 to S22 until the beam scan processing on all the processing target regions is completed.

When the beam scan processing on all the processing target regions is completed, so that the result of the evaluation in step S22 is YES, the laser processing controller 100 terminates the flowchart of FIG. 4.

1.2.5.2 Details of Reading of Laser Processing Condition Parameters

Figure 5:
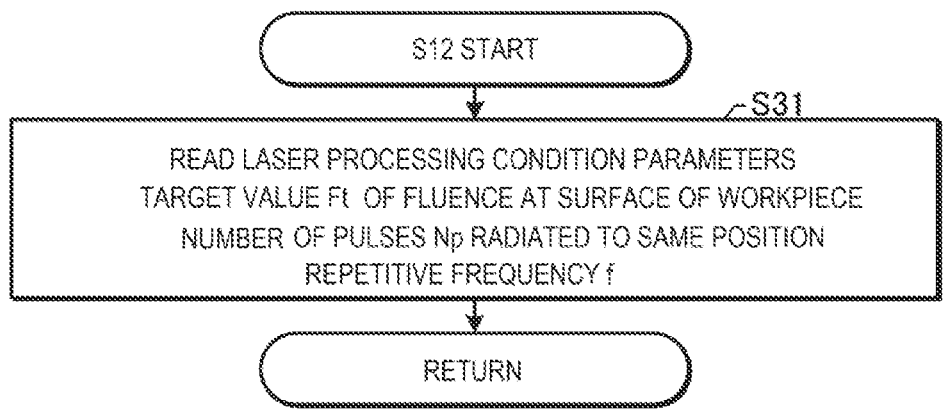
FIG. 5 is a flowchart showing an example of the content of the process of reading laser processing condition parameters.

FIG. 5 is a flowchart showing an example of the content of the process of reading the laser processing condition parameters. The flowchart shown in FIG. 5 corresponds to the subroutine of step S12 in FIG. 4.

In step S31, the laser processing controller 100 reads the following laser processing condition parameters from a storage apparatus that is now shown.

(a) Target value Ft of the fluence F at the surface of the workpiece 160
(b) The number of pulses Np radiated to the same position
(c) Repetitive frequency f The Number of pulses Np radiated to the same position is, for example, an integer greater than or equal to two.

After step S31, the laser processing controller 100 returns to the main procedure in FIG. 4.

1.2.5.3 Details of Calculation and Setting of Control Parameters

Figure 6:
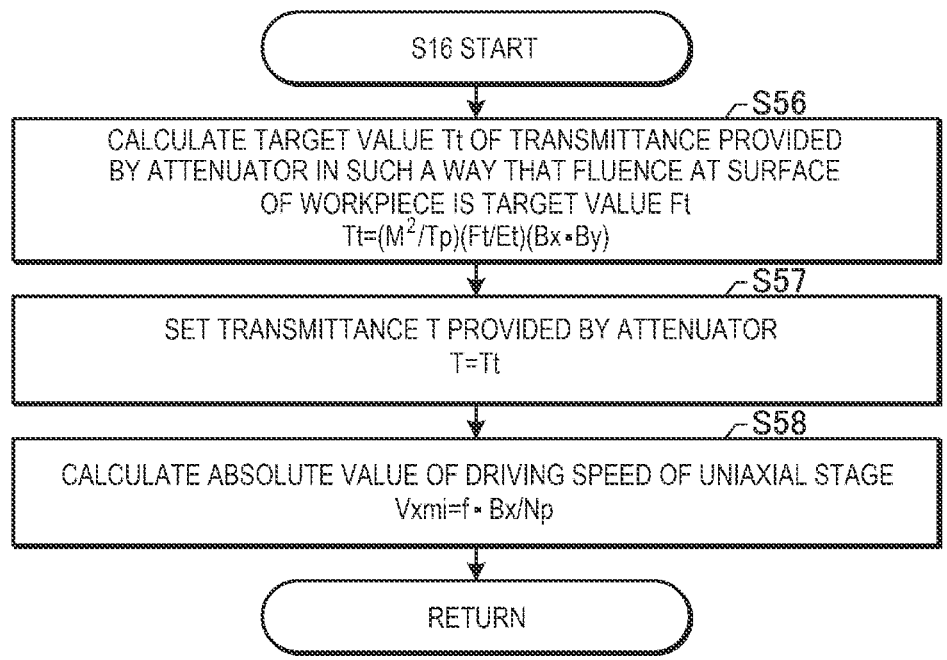
FIG. 6 is a flowchart showing an example of the content of the process of calculating and setting control parameters for controlling the laser processing apparatus 14.

FIG. 6 is a flowchart showing an example of the content of the process of calculating and setting the control parameters for controlling the laser processing apparatus 14. The flowchart shown in FIG. 6 corresponds to the subroutine of step S16 in FIG. 4.

In step S56, the laser processing controller 100 calculates a target value Tt of transmittance T provided by the attenuator 120 in such a way that fluence F at the surface of the workpiece 160 is the target value Ft. The target value Tt is calculated as follows.

First, let Tp be the transmittance provided by the optical system along which the laser light outputted from the laser apparatus 12 reaches the workpiece 160 when the attenuator 120 provides the maximum transmittance. Let M be the magnification factor of the projection optical system 145. The fluence F at the surface of the workpiece 160 is expressed by Expression (1) below, in which pulse energy T·Tp·Et at the surface of the workpiece 160 is divided by an area $M^2 \cdot Bx \cdot By$ of the laser light irradiated region 161 of the workpiece 160.

$$F = M^2(T \cdot Tp \cdot Et)/(Bx \cdot By) \quad (1)$$

Based on Expression (1), the target value Tt of the transmittance T provided by the attenuator 120 and set to achieve the target value Ft of the fluence F at the surface of the workpiece 160 is expressed by Expression (2) below.

$$Tt = (M^2/Tp)(Ft/Et)(Bx \cdot By) \quad (2)$$

In step S57, the laser processing controller 100 sets the transmittance T provided by the attenuator 120 at the target value Tt. That is, the laser processing controller 100 controls the rotary stages 123 and 124 to adjust the angles of the partial reflection mirrors 121 and 122 in such a way that the transmittance T provided by the attenuator 120 approaches the target value Tt.

Thereafter, in step S58, the laser processing controller 100 calculates an absolute value Vxmi of the driving speed of the uniaxial stage 138. The absolute value Vxmi of the driving speed of the uniaxial stage 138 is equal to an absolute value |Vxm| of a moving speed Vxm of the laser light irradiated region 141 of the mask 140. A period required to radiate the pulsed laser light having the repetitive frequency f Np times to the same position is Np/f. The absolute value of the driving speed of the uniaxial stage 138 is expressed by Expression (3) below, in which the radiation width Bx in the direction parallel to the short edges of the irradiated region 141 is divided by the required period Np/f.

$$Vxmi = f \cdot Bx/Np \quad (3)$$

After step S58, the laser processing controller 100 leaves the flowchart of FIG. 6 and returns to the main procedure in FIG. 4.

1.2.5.4 Details of Beam Scan Processing

Figure 7:
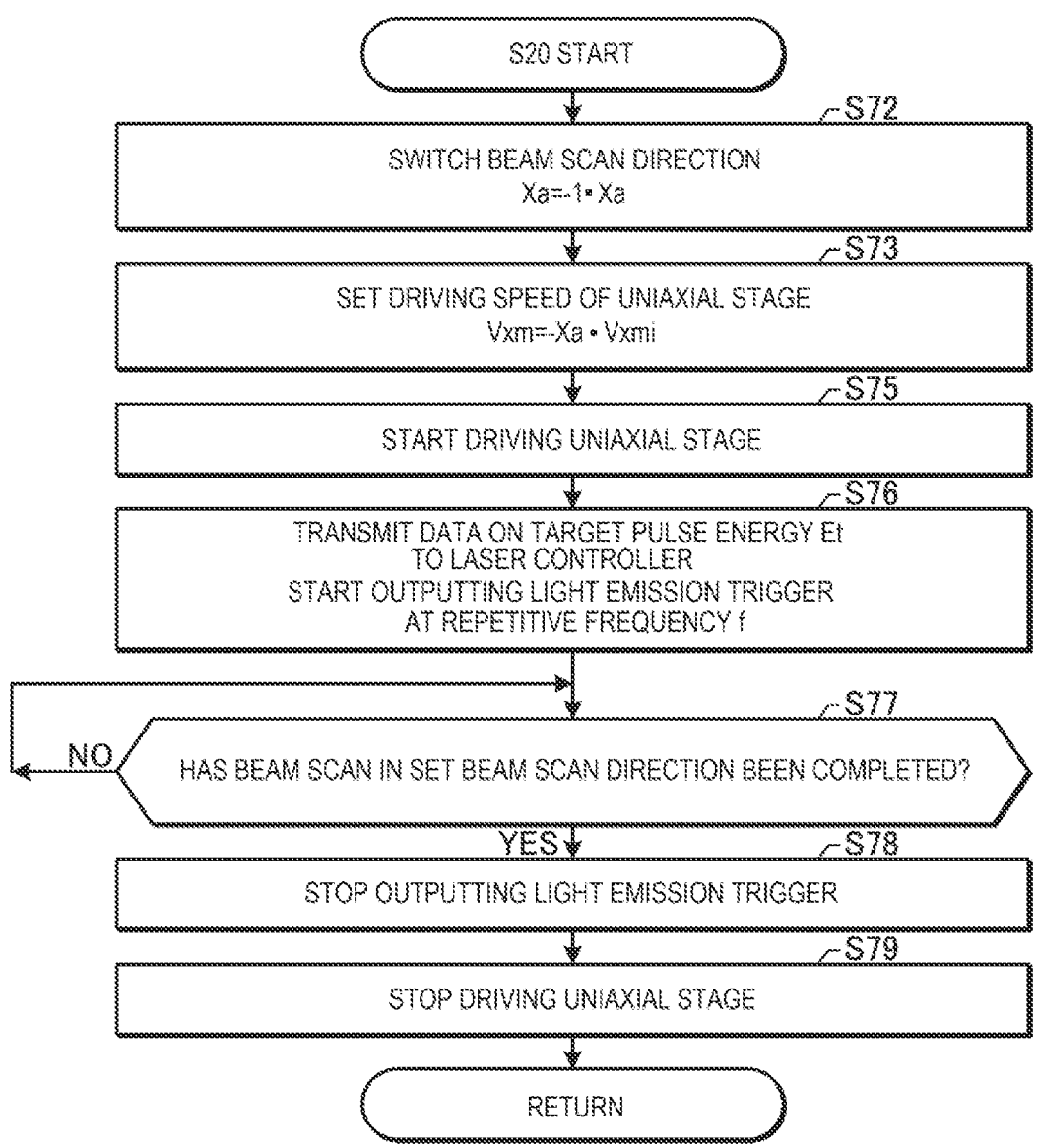
FIG. 7 is a flowchart showing an example of the content of the process of performing beam scan processing.

FIG. 7 is a flowchart showing an example of the content of the process of performing the beam scan processing. The flowchart shown in FIG. 7 corresponds to the subroutine of step S20 in FIG. 4.

In step S72, the laser processing controller 100 multiplies the value of the parameter Xa by −1. That is, the laser processing controller 100 reverses the positive or negative sign of the parameter Xa to switch the beam scan direction to the direction opposite the beam scan direction set last time.

In step S17 in FIG. 4, the value of the parameter Xa is set at the initial value of −1 by way of example. In this case, when the processes in FIG. 7 are carried out for the first time, the value of the parameter Xa is set at 1.

When the value of the parameter Xa is 1, the direction in which the irradiated region 161 moves on the surface of the workpiece 160 is, for example, the positive direction of the axis X or the leftward direction in FIG. 3. When the value of the parameter Xa is −1, the direction in which the irradiated region 161 moves on the surface of the workpiece 160 is the negative direction of the axis X or the rightward direction in FIG. 3.

After step S72, the laser processing controller 100 proceeds to step S73.

In step S73, the laser processing controller 100 sets the driving speed of the uniaxial stage 138. The driving speed of the uniaxial stage 138 is equal to both the moving speed Vxm of the beam shaping optical system 130 during its constant linear motion and the moving speed Vxm of the irradiated region 141 and is determined in accordance with Expression (4) below.

$$Vxm = -Xa \cdot Vxmi \quad (4)$$

Further, in step S73, a variety of parameters for controlling the uniaxial stage 138 may be so set that acceleration and deceleration before and after the constant linear motion are each performed for a predetermined period.

When the moving speed Vxm determined by Expression (4) has a negative value, the driving direction of the uniaxial stage 138 is the negative direction of the axis X. As a result, the direction in which the laser light irradiated region 161 of the workpiece 160 moves is the positive direction of the axis X.

When the moving speed Vxm determined by Expression (4) has a positive value, the driving direction of the uniaxial stage 138 is the positive direction of the axis X. As a result, the direction in which the laser light irradiated region 161 of the workpiece 160 moves is the negative direction of the axis X.

In step S75, the laser processing controller 100 starts driving the uniaxial stage 138. The uniaxial stage 138 accelerates the beam shaping optical system 130 and then causes it to make the constant linear motion.

In step S76, the laser processing controller 100 transmits the data on the target pulse energy Et to the laser controller 28. Further, the laser processing controller 100 starts outputting the light emission trigger at the repetitive frequency f to the laser controller 28. The laser apparatus 12 thus starts outputting the laser light. The uniaxial stage 138 is so controlled that the irradiated region 141 at the point of time when the laser apparatus 12 starts outputting the laser light coincides with the initial position 141s.

In step S77, the laser processing controller 100 evaluates whether or not the beam scan in the set beam scan direction has been completed. That is, the laser processing controller 100 evaluates whether or not the irradiated region 141 has moved in the X-axis direction from one end to the other end of the patterned region 140p of the mask 140.

The laser processing controller 100 repeats step S77 until the result of the evaluation in step S77 becomes YES. The processing target regions of the workpiece 160 are thus irradiated with the laser light. When the result of the evaluation in step S77 is YES, the laser processing controller 100 proceeds to step S78.

In step S78, the laser processing controller 100 stops outputting the light emission trigger. The laser apparatus 12 thus stops outputting the laser light.

In step S79, the laser processing controller 100 stops driving the uniaxial stage 138. The beam shaping optical system 130 is thus decelerated and then stopped.

After step S79, the laser processing controller 100 leaves the flowchart of FIG. 7 and returns to the main procedure in FIG. 4.

1.3 Problems

In Comparative Example described above, the transmittance provided by the attenuator 120 is changed to cause the fluence F to approach the target value Ft. When the attenuator 120 provides maximum transmittance, the fluence F has a maximum value Fmax. The fluence F can be lowered to a value close to the target value Ft smaller than or equal to the maximum value Fmax by changing the transmittance provided by the attenuator 120. A fluence F greater than the maximum value Fmax has not, however, been obtained.

A case where the target value Ft of the fluence F is high can be handled by increasing the maximum value Fmax. When the maximum value Fmax is increased, however, the fluence F cannot be reduced to the same target value Ft unless the transmittance provided by the attenuator 120 is lowered as compared with the case where the maximum value Fmax is low, resulting in a large waste of energy. Further, even when the maximum value Fmax is increased, but when the target value Ft of the fluence F is low, the laser apparatus has not been capable of achieving laser processing productivity appropriate for the capability thereof.

The laser processing apparatus 14 according to the embodiment described below is configured to be capable of changing the radiation width By in the direction parallel to the long sides of the irradiated region 141. The laser processing apparatus 14 is further configured to be capable of moving the irradiated region 141 in the Y-axis direction. When the target value Ft of the fluence F is high, the fluence F can be increased by reducing the radiation width By in the direction parallel to the long sides of the irradiated region 141. The entire mask can be irradiated by performing the beam scan multiple times while moving the irradiated region 141 in the Y-axis direction whenever the beam scan is performed once.

Figure 8:
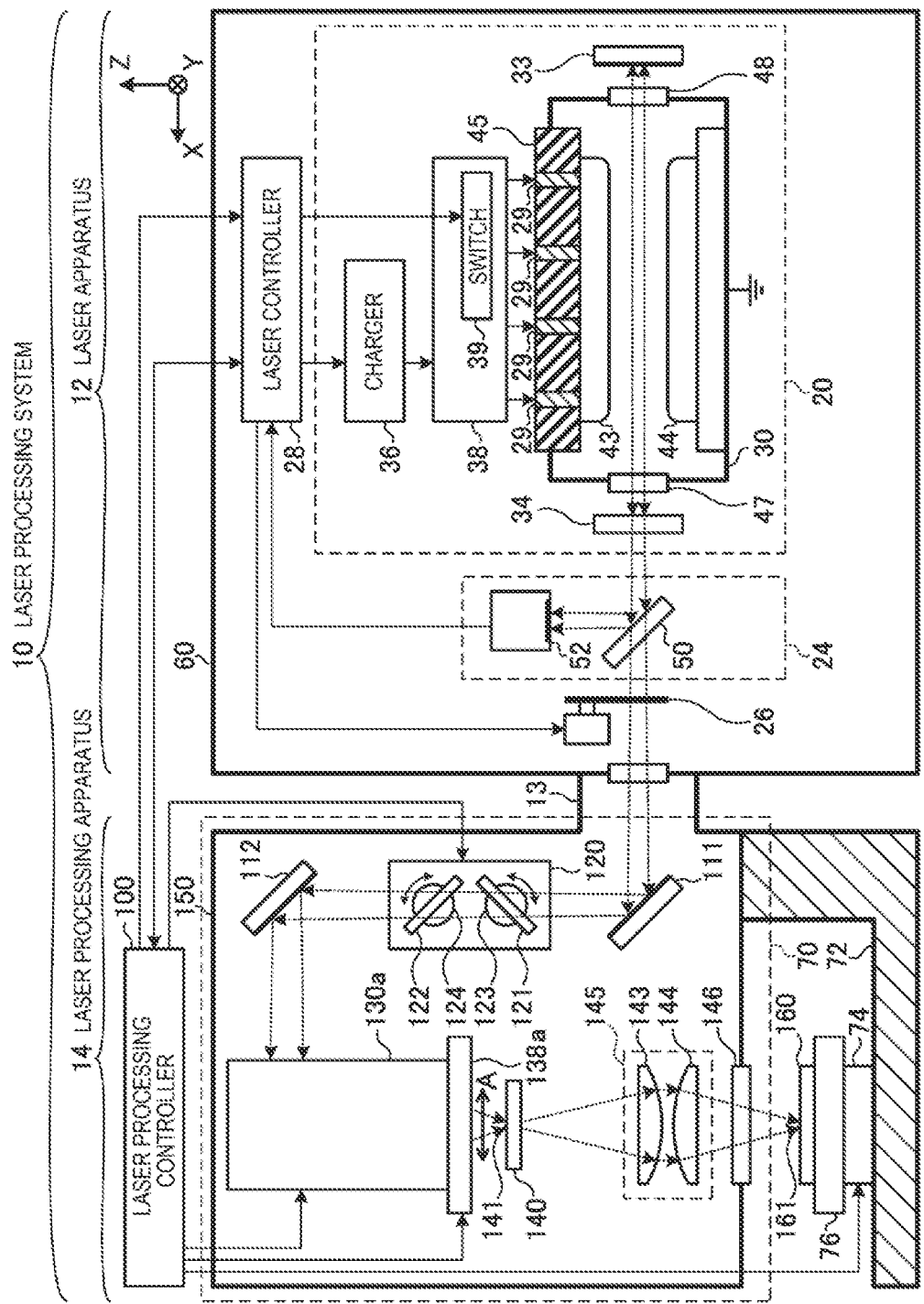
FIG. 8 schematically shows the configuration of the laser processing system 10 including the laser processing apparatus 14 according to an embodiment of the present disclosure.

2. Laser Processing Apparatus Capable of Changing Radiation Width and Irradiated Region 2.1 Configuration FIG. 8 schematically shows the configuration of the laser processing system 10 including the laser processing apparatus 14 according to the embodiment of the present disclosure. In the present embodiment, the laser processing apparatus 14 includes a beam shaping optical system 130a and a uniaxial stage 138a in place of the beam shaping optical system 130 and the uniaxial stage 138 described with reference to FIG. 1.

2.1.1 Configuration of Beam Shaping Optical System

Figure 9A:
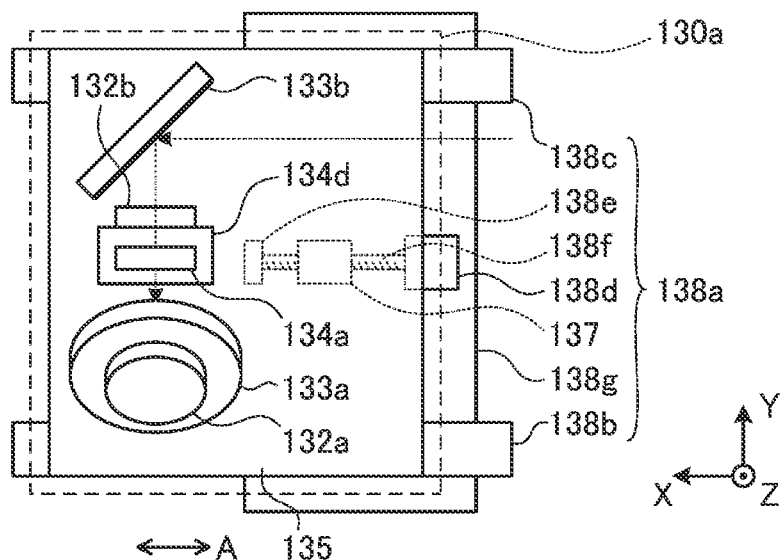
FIG. 9A is a plan view of a beam shaping optical system 130*a* and a uniaxial stage 138*a* provided in the laser processing apparatus 14 according to the present embodiment and viewed in the negative side of an axis Z.

FIG. 9A is a plan view of the beam shaping optical system 130a and the uniaxial stage 138a provided in the laser processing apparatus 14 according to the present embodiment and viewed in the negative side of the axis Z.

Figure 9B:
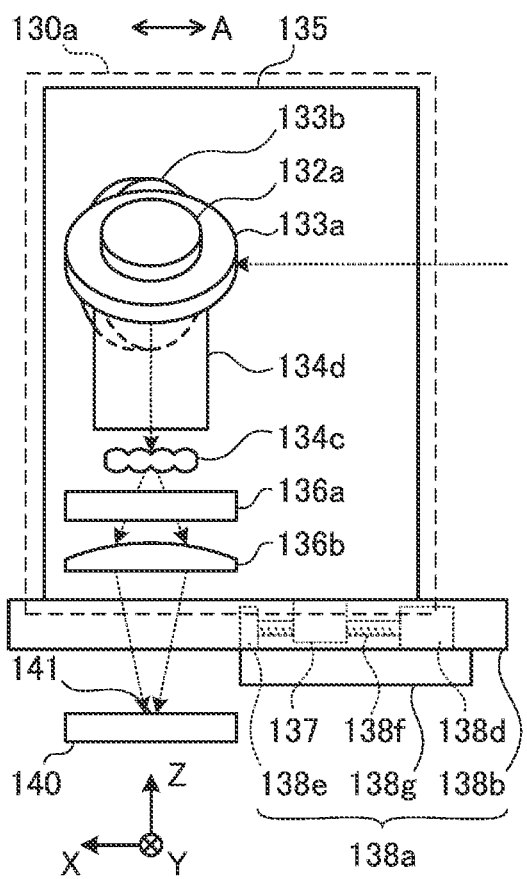
FIG. 9B is a front view of the beam shaping optical system 130*a* and the uniaxial stage 138*a* provided in the laser processing apparatus 14 according to the present embodiment and viewed in the positive side of an axis Y.

FIG. 9B is a front view of the beam shaping optical system 130a and the uniaxial stage 138a provided in the laser processing apparatus 14 according to the present embodiment and viewed in the positive side of the axis Y.

Figure 9C:
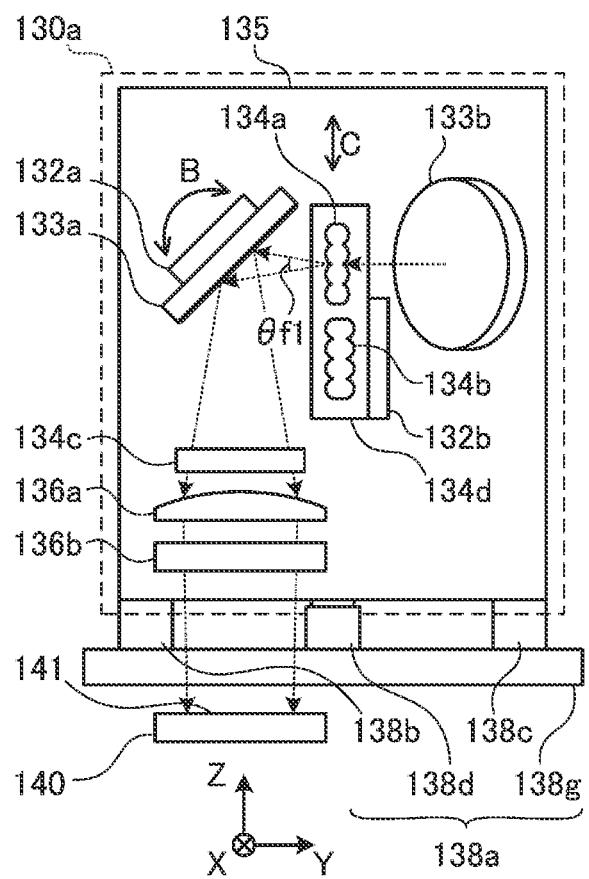
FIG. 9C is a right side view of the beam shaping optical system 130a and the uniaxial stage 138a provided in the laser processing apparatus 14 according to the present embodiment and viewed in the positive side of an axis X.

FIG. 9C is a right side view of the beam shaping optical system 130a and the uniaxial stage 138a provided in the laser processing apparatus 14 according to the present embodiment and viewed in the positive side of the axis X.

The beam shaping optical system 130a includes first and second actuators 132a and 132b, first and second mirrors 133a and 133b, and first, second, third fly-eye lenses 134a, 134b, and 134c, and first and second condenser lenses 136a and 136b. The components described above are accommodated in the enclosure 135.

The second mirror 133b is disposed in the optical path of the laser light reflected off the high-reflectance mirror 112 toward the positive side of the axis X. The second mirror 133b is configured to reflect the laser light toward the negative side of the axis Y.

The first mirror 133a is disposed in the optical path of the laser light reflected off the second mirror 133b toward the negative side of the axis Y. The first mirror 133a is configured to reflect the laser light toward the negative side of the axis Z.

The first and second fly-eye lenses 134a, 134b are held by a holder 134d. The holder 134d is so supported by the second actuator 132b as to be movable along with the first and second fly-eye lenses 134a, 134b in the Z-axis direction indicated by a bidirectional arrow C. The first and second fly-eye lenses 134a and 134b are selectively disposed in the optical path of the laser light between the first mirror 133a and the second mirror 133b. That is, the second actuator 132b is configured to switch the state of the fly-eye lenses between a first state in which the first fly-eye lens 134a is placed in the optical path of the laser light and a second state in which the second fly-eye lens 134b is placed in the optical path of the laser light. The second actuator 132b operates based on a control signal outputted from the laser processing controller 100.

The first and second fly-eye lenses 134a and 134b each have a plurality of cylindrical surfaces. The first and second fly-eye lenses 134a, 134b are each so configured that when placed in the optical path of the laser light, the plurality of cylindrical surfaces are arranged in the Z-axis direction and each have a focal axis parallel to the axis X (see FIG. 9C).

The first condenser lens 136a is disposed in the optical path of the laser light reflected off the first mirror 133a toward the negative side of the axis Z. The first condenser lens 136a has a cylindrical surface. The first condenser lens 136a is so disposed that the cylindrical surface thereof has a focal axis parallel to the axis X (see FIG. 9C).

The laser light having passed through either of the first and second fly-eye lenses 134a, 134b enters the first condenser lens 136a. The optical intensity distribution of the laser light in the Y-axis direction on the surface of the mask 140 is homogenized by the first condenser lens 136a and either of the first and second fly-eye lenses 134a, 134b.

The third fly-eye lens 134c is disposed in the optical path of the laser light between the first mirror 133a and the first condenser lens 136a. That is, the first mirror 133a is disposed between the fly-eye lens disposed in the optical path of the laser light, out of the first and second fly-eye lenses 134a, 134b, and the third fly-eye lens 134c. The third fly-eye lens 134c has a plurality of cylindrical surfaces arranged in the X-axis direction. The third fly-eye lens 134c is so disposed that the plurality of cylindrical surfaces thereof each have a focal axis parallel to the axis Y (see FIG. 9B).

The third fly-eye lens 134c may instead be disposed between the fly-eye lens disposed in the optical path of the laser light, out of the first and second fly-eye lenses 134a, 134b, and the first mirror 133a. In this case, the plurality of cylindrical surfaces of the third fly-eye lens 134c each have a focal axis parallel to the axis Z.

The second condenser lens 136b is disposed in the optical path of the laser light having passed through the first condenser lens 136a. The second condenser lens 136b has a cylindrical surface. The second condenser lens 136b is so disposed that the cylindrical surface thereof has a focal axis parallel to the axis Y (see FIG. 9B).

The laser light having passed through the third fly-eye lens 134c enters the second condenser lens 136b. The third fly-eye lens 134c and the second condenser lens 136b homogenize the optical intensity distribution of the laser light in the X-axis direction on the surface of the mask 140.

As described above, the optical intensity distribution of the laser light is homogenized in each of the X-axis and Y-axis directions, and the rectangular irradiated region 141 is formed. The change in the radiation width By in the direction parallel to the long edges of the irradiated region 141 depends on which of the first and second fly-eye lenses 134a, 134b is placed in the optical path of the laser light, as will be described below.

FIG. 9C shows the first state, in which the first fly-eye lens 134a is placed in the optical path of the laser light. Assume that parallelized light enters the first fly-eye lens 134a via one surface thereof, and let $\theta f1$ be an angle of divergence of the light that exits via the other surface of the first fly-eye lens 134a. The angle of divergence $\theta f1$ is expressed in the form of a full angle.

Figure 10:
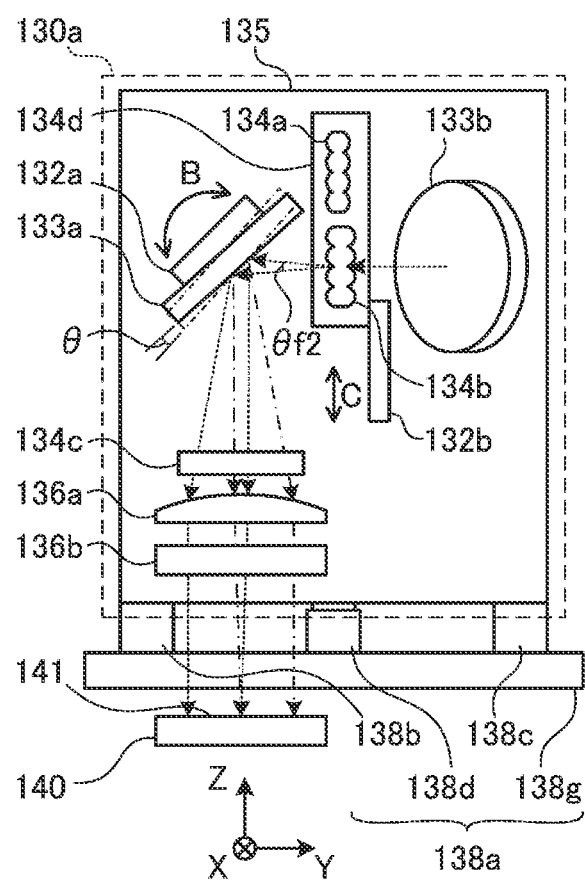
FIG. 10 is a right side view showing a second state in which a second fly-eye lens 134b is placed in an optical path of the laser light in the beam shaping optical system 130a provided in the laser processing apparatus 14 according to the present embodiment.

FIG. 10 is a right side view showing the second state, in which the second fly-eye lens 134b is placed in the optical path of the laser light in the beam shaping optical system 130a provided in the laser processing apparatus 14 according to the present embodiment. Assume that parallelized light enters the second fly-eye lens 134b via one surface thereof, and let $\theta f2$ be an angle of divergence of the light that exits via the other surface of the second fly-eye lens 134b. The angle of divergence $\theta f2$ is expressed in the form of a full angle.

The first and second fly-eye lenses 134a, 134b have focal lengths different from each other and provide angles of divergence different from each other. For example, let F1 be a combined focal length of the first fly-eye lens 134a, and F2 be a combined focal length of the second fly-eye lens 134b, and the combined focal length F1 may be smaller than the combined focal length F2. In this case, the angle of divergence $\theta f1$ is greater than the angle of divergence $\theta f2$.

For example, when the combined focal length F1 is half the combined focal length F2, and the combined focal length F1 and the combined focal length F2 are sufficiently large, the angle of divergence $\theta f1$ is twice the angle of divergence $\theta f2$.

In the first state, since the angle of divergence $\theta f1$ of the first fly-eye lens 134a is large, the radiation width By in the direction parallel to the long edges of the irradiated region 141 has a large value. In contrast, in the second state, since the angle of divergence $\theta f2$ of the second fly-eye lens 134b is small, the radiation width By in the direction parallel to the long edges of the irradiated region 141 has a small value. For example, when the angle of divergence $\theta f1$ is twice as large as the angle of divergence $\theta f2$, the radiation width By in the direction parallel to the long edges of the irradiated region 141 in the first state is twice the radiation width By in the direction parallel to the long edges of the irradiated region 141 in the second state.

The beam shaping optical system 130a can change the radiation width By in the direction parallel to the long edges of the irradiated region 141 of the laser light at the mask 140 independently of the radiation width Bx in the direction parallel to the short edges of the irradiated region 141. It is preferable that the radiation width Bx in the direction parallel to the short edges is fixed and the radiation width By in the direction parallel to the long edges is changed. The radiation width Bx in the direction parallel to the short edges corresponds to the first radiation width in the present disclosure. The radiation width By in the direction parallel to the long edges corresponds to the second radiation width in the present disclosure.

For example, when the radiation width By in the direction parallel to the long edges of the irradiated region 141 in the first state is 100 mm, the parameters of the first fly-eye lens 134a are set as follows:

(i) Combined focal length F1: 20 mm
(ii) Lens pitch: 5 mm

Further, for example, when the radiation width By in the direction parallel to the long edges of the irradiated region 141 in the second state is 50 mm, the parameters of the second fly-eye lens 134b are set as follows:
(i) Combined focal length F2: 40 mm
(ii) Lens pitch: 5 mm When the parameters of the first and second fly-eye lens 134a, 134b are set as described above, the focal length of the first condenser lens 136a is set, for example, at 400 mm.

The first actuator 132a is configured to be capable of changing the posture of the first mirror 133a. The first actuator 132a is configured to be capable of rotating the first mirror 133a around an axis parallel to the axis X. The direction of the rotation of the first mirror 133a rotated by the first actuator 132a is indicated by a bidirectional arrow B. The first actuator 132a can move the laser light irradiated region 141 of the mask 140 in the Y-axis direction by rotating the first mirror 133a around the axis parallel to the axis X. The first actuator 132a operates based on a control signal outputted from the laser processing controller 100.

When the first mirror 133a is rotated around the axis parallel to the axis X, the direction of the center axis of the optical path of the laser light reflected off the first mirror 133a changes by the angle twice an angle of rotation θ by which the first mirror 133a is rotated. In view of the fact described above, the first mirror 133a is rotated by half the angle of divergence θf2 of the second fly-eye lens 134b in the second state. The direction of the center axis of the optical path of the laser light reflected off the first mirror 133a thus changes by the angle equal to the angle of divergence θf2. In this process, the distance over which the irradiated region 141 moves along the Y-axis direction is substantially equal to the radiation width By in the direction parallel to the long edges of the irradiated region 141 in the second state.

2.1.2 Configuration of Uniaxial Stage

The uniaxial stage 138a includes a linear guide including rails 138b and 138c, a motor 138d, a bearing 138e, a ball screw 138f, a plate 138g, and a nut 137, as shown in FIGS. 9A to 9C and FIG. 10. The uniaxial stage 138a corresponds to the mover in the present disclosure.

The rails 138b and 138c are fixed to the plate 138g. The rails 138b and 138c support the enclosure 135 in such a way that the enclosure 135 can slide relative to the plate 138g in the X-axis direction indicated by the bidirectional arrow A. As the linear guide including the rails 138b and 138c, for example, "SHS15" series provided by THK Co., Ltd. can be used.

The nut 137 is fixed to the enclosure 135. The ball screw 138f is screwed into the nut 137 and passes through the nut 137. As the ball screw 138f, for example, "DIK" series provided by THK Co., Ltd. can be used.

The motor 138d and the bearing 138e are fixed to the plate 138g. One end and the other end of the ball screw 138f in the longitudinal direction thereof are supported by the motor 138d and the bearing 138e, respectively. The longitudinal direction of the ball screw 138f coincides with the X-axis direction. The motor 138d is configured to rotate the ball screw 138f around the longitudinal axis of the ball screw 138f. The motor 138d operates based on a control signal outputted from the laser processing controller 100.

The motor 138d rotates the ball screw 138f, and the ball screw 138f in turn moves the nut 137 in the X-axis direction. The beam shaping optical system 130a thus moves in the X-axis direction. When the beam shaping optical system 130a moves in the X-axis direction, the irradiated region 141 moves in the X-axis direction.

Since the traveling direction of the laser light incident via the high-reflectance mirror 112 on the second mirror 133b of the beam shaping optical system 130a is parallel to the axis X, even when the beam shaping optical system 130a moves in the X-axis direction, shift of the position of the second mirror 133b from the optical path of the laser light can be suppressed.

The other points of the configuration in the present embodiment are the same as those in Comparative Example.

2.2 Operation
2.2.1 Movement of Irradiated Region of Mask

Figure 11A:
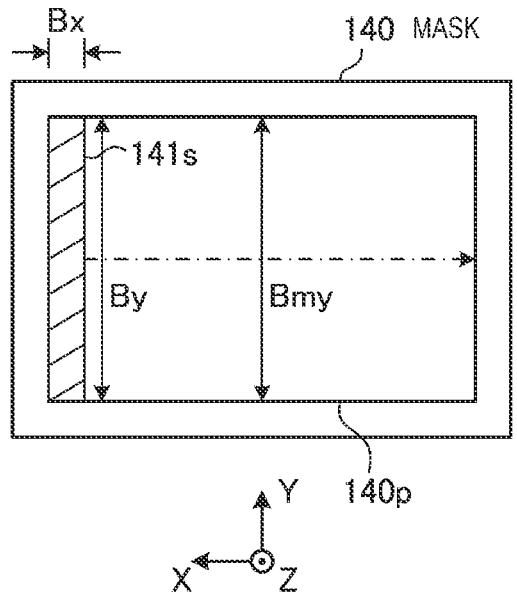
FIGS. 11A and 11B are plan views showing examples of the mask 140 irradiated with the laser light in the present embodiment.
Figure 11B:
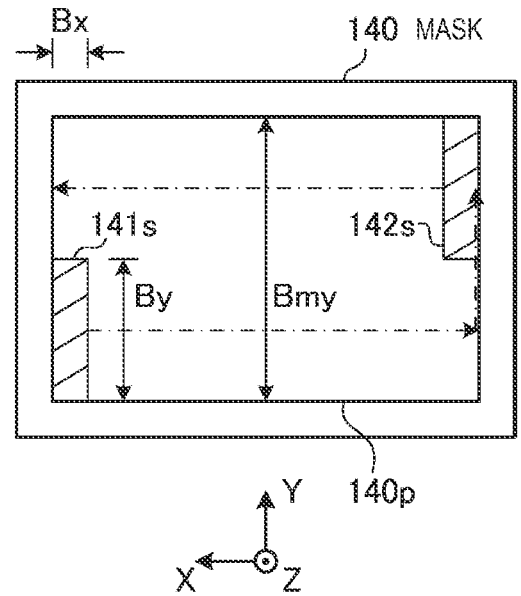

FIGS. 11A and 11B are plan views showing examples of the mask 140 irradiated with the laser light in the present embodiment. The beam shaping optical system 130a is configured to be capable of changing the radiation width By in the direction parallel to the long edges of the laser light irradiated region 141 of the mask 140 independently of the radiation width Bx in the direction parallel to the short edges of the laser light irradiated region 141, as described above. FIG. 11A shows the first state, and FIG. 11B shows the second state. The shape and size in the initial position 141s shown in FIGS. 11A and 11B correspond to the shape and size of the irradiated region 141.

2.2.1.1 First State

When the target value Ft of the fluence F is low, the second actuator 132b is so controlled that the first fly-eye lens 134a operates in the first state, in which the first fly-eye lens 134a is disposed in the optical path of the laser light (see FIG. 9C).

The radiation width By in the direction parallel to the long edges of the irradiated region 141 thus increases, whereby the beam scan can be efficiently performed on the mask 140. The radiation width By in the direction parallel to the long edges of the irradiated region 141 in the first state can be, for example, greater than or equal to a mask width Bmy in the Y-axis direction.

The first mirror 133a is so set by the first actuator 132a as to take a predetermined posture. The predetermined posture is, for example, a reference posture. The reference posture refers to the posture of the first mirror 133a that causes the center axis of the optical path of the laser light incident on the mask 140 to coincide with the center of the mask 140 in the Y-axis direction. The beam scan is performed by driving the uniaxial stage 138a with the first mirror 133a set to take the predetermined posture.

When the radiation width By in the direction parallel to the long edges of the irradiated region 141 is greater than or equal to the mask width Bmy in the Y-axis direction, as shown in the initial position 141s in FIG. 11A, the entire mask 140 can be irradiated in single beam scan action. Therefore, in this case, the first mirror 133a may be immobile with the reference posture thereof unchanged.

2.2.1.2 Second State

When the target value Ft of the fluence F is high, the second actuator 132b is so controlled that the second fly-eye lens 134b operates in the second state, in which the second fly-eye lens 134b is disposed in the optical path of the laser light (see FIG. 10).

The radiation width By in the direction parallel to the long edges of the irradiated region 141 therefore decreases, and the fluence F at the surface of the mask 140 increases. The radiation width By in the direction parallel to the long edges of the irradiated region 141 in the second state can, for example, be smaller than the mask width Bmy in the Y-axis direction.

When the radiation width By in the direction parallel to the long edges of the irradiated region 141 in the second state is smaller than the mask width Bmy in the Y-axis direction, it is necessary for irradiation of the entire mask 140 to perform the beam scan action multiple times while shifting the irradiated region 141 in the Y-axis direction.

To shift the irradiated region 141 in the Y-axis direction, the first actuator 132a changes the posture of the first mirror 133a. For example, the first mirror 133a can take a first posture that causes the first mirror 133a to be tilted by a first angle in a first direction with respect to the reference posture and a second posture that causes the first mirror 133a to be tilted by a second angle in a second direction opposite the first direction with respect to the reference posture. An example of the first posture of the first mirror 133a is drawn with the solid line in FIG. 10, and the optical path of the laser light reflected off the first mirror 133a that takes the first posture is drawn with the dotted line in FIG. 10. An example of the second posture of the first mirror 133a is drawn with the chain line in FIG. 10, and the optical path of the laser light reflected off the first mirror 133a that takes the second posture is drawn with the chain line in FIG. 10.

The irradiated region 141 is moved in the X-axis direction from the initial position 141s shown in FIG. 11B by driving the uniaxial stage 138a in the X-axis direction with the first mirror 133a taking the first posture, and the first beam scan is performed. The irradiated region 141 is then moved in the Y-axis direction by By by changing the posture of the first mirror 133a to the second posture. Further, the irradiated region 141 is moved from an initial position 142s shown in FIG. 11B in the direction opposite the direction in the first beam scan by driving the uniaxial stage 138a with the first mirror 133a taking the second posture, and the second beam scan is performed. The entire mask 140 can thus be irradiated by performing the beam scan multiple times.

2.2.2 Movement of Irradiated Region of Workpiece

Figure 12:
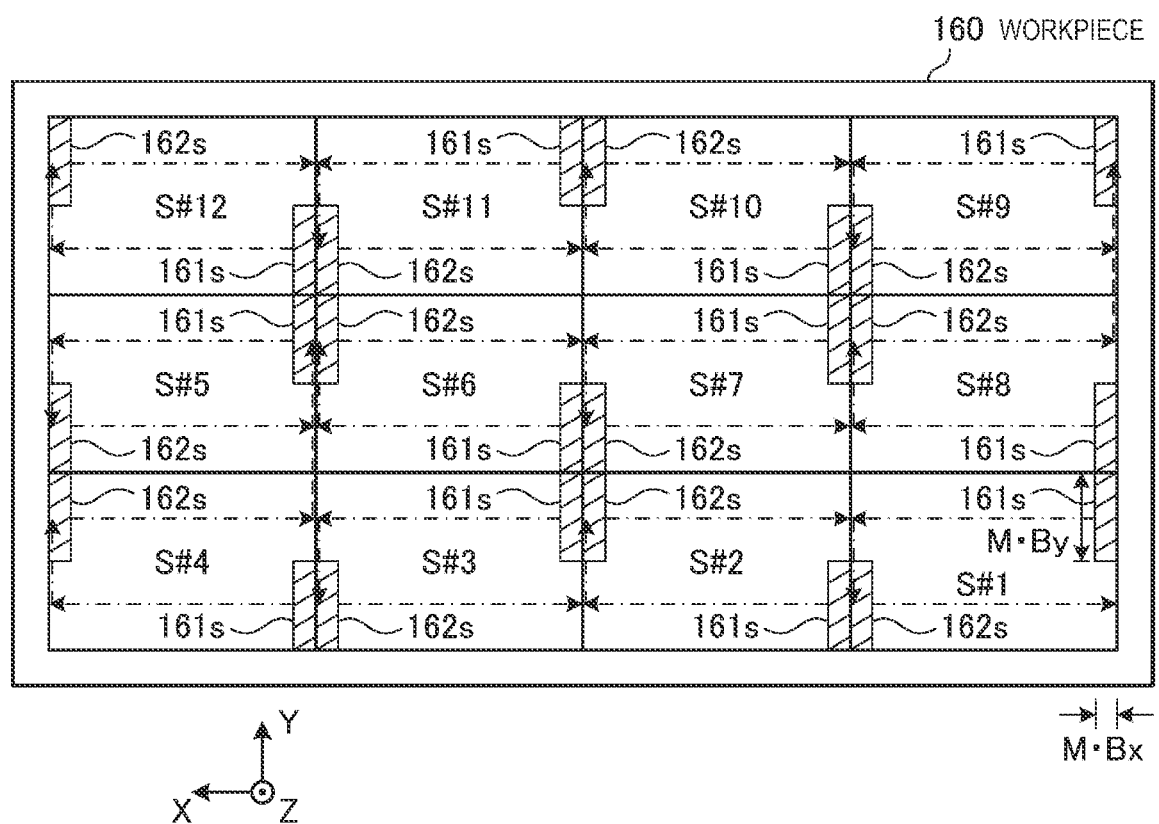
FIG. 12 is a plan view showing an example of a method for processing the workpiece 160 with the laser light in the second state in the present embodiment.

FIG. 12 is a plan view showing an example of a method for processing the workpiece 160 with the laser light in the second state in the present embodiment. The processing target regions from "S #1" to "S #12" shown in FIG. 12 are the same as those described with reference to FIG. 3. A method for processing the workpiece 160 with the laser light in the first state is the same as the method described with reference to FIG. 3 and will therefore not be described.

The XYZ stage 74 is first so operated as to move the workpiece 160 that the region where the inverted image of the mask 140 is formed coincides with the first processing target region S #1, and the XYZ stage 74 is then stopped.

The first mirror 133a is then caused to take the first posture. The mask 140 is then irradiated with the laser light, and the laser light irradiated region 141 of the mask 140 is moved by the uniaxial stage 138a rightward from the initial position 141s in FIG. 11B. The laser light irradiated region 161 of the workpiece 160 thus moves leftward from the initial position 161s in the processing target region S #1 in FIG. 12. When the first beam scan action is completed, the radiation of the laser light is stopped.

The laser light irradiated region 141 of the mask 140 is then moved upward in FIG. 11B by By by causing the first mirror 133a to take the second posture. The laser light irradiated region 161 of the workpiece 160 thus moves in the downward direction in FIG. 12.

The mask 140 is then irradiated with the laser light, and the laser light irradiated region 141 of the mask 140 is moved by the uniaxial stage 138a leftward from the initial position 142s in FIG. 11B. The laser light irradiated region 161 of the workpiece 160 thus moves rightward from an initial position 162s in the processing target region S #1 in FIG. 12. When the second beam scan action is completed, the radiation of the laser light is stopped.

The processing of the processing target region S #1 is completed by performing the beam scan action n times.

The XYZ stage 74 is then so operated as to move the workpiece 160 that the region where the inverted image of the mask 140 is formed coincides with the following processing target region S #2, and the XYZ stage 74 is stopped. The beam scan action is then performed n times, as in the processing of the first processing target region S #1. It is, however, noted that the direction in which the laser light irradiated region 141 of the mask 140 moves is reversed from the direction used to process the first processing target region S #1. The laser light irradiated region 161 of the workpiece 160 therefore moves leftward from the initial position 161s in the processing target region S #2 in FIG. 12, moves upward, and then moves rightward from the initial position 162s.

Operating the XYZ stage 74 in the X-axis or Y-axis direction as described above changes the processing target region in the order of "S #1," "S #2," "S #3," . . . , "S #12." The laser processing is performed by performing the beam scan n times on a processing target region basis.

Figure 13:
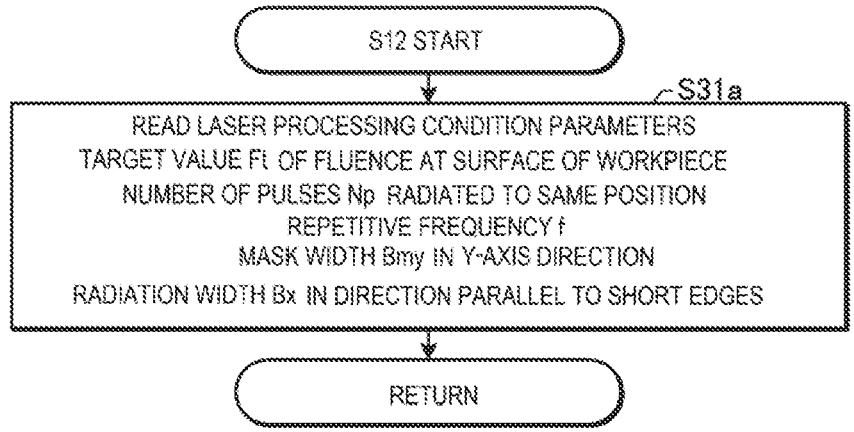
FIG. 13 is a flowchart showing an example of the content of the laser processing condition parameter reading process carried out in the present embodiment.

2.2.3 Operation of Laser Processing Controller 2.2.3.1 Reading of Laser Processing Condition Parameters FIG. 13 is a flowchart showing an example of the content of the laser processing condition parameter reading process carried out in the present embodiment. The flowchart shown in FIG. 13 corresponds to the subroutine of step S12 in FIG. 4 and is carried out in place of the flowchart in FIG. 5 in Comparative Example described above.

In step S31a, the laser processing controller 100 reads the following laser processing condition parameters from a storage apparatus that is not shown.

(a) Target value Ft of the fluence F at the surface of the workpiece 160
(b) The number of pulses Np radiated to the same position
(c) Repetitive frequency f
(d) Mask width Bmy in the Y-axis direction
(e) Radiation width Bx in the direction parallel to the short edges The items (a) to (c) described above are the same as those in Comparative Example.

The Y-axis direction in the item (d) described above corresponds to the direction parallel to the long edges of the irradiated region 141. The mask width Bmy in the Y-axis direction may be the width of the patterned region 140p, where the mask pattern is formed.

The radiation width Bx in the direction parallel to the short edges in the item (e) described above is the radiation width of the irradiated region 141.

After step S31a, the laser processing controller 100 returns to the main procedure in FIG. 4.

2.2.3.2 Calculation and Setting of Control Parameters

Figure 14:
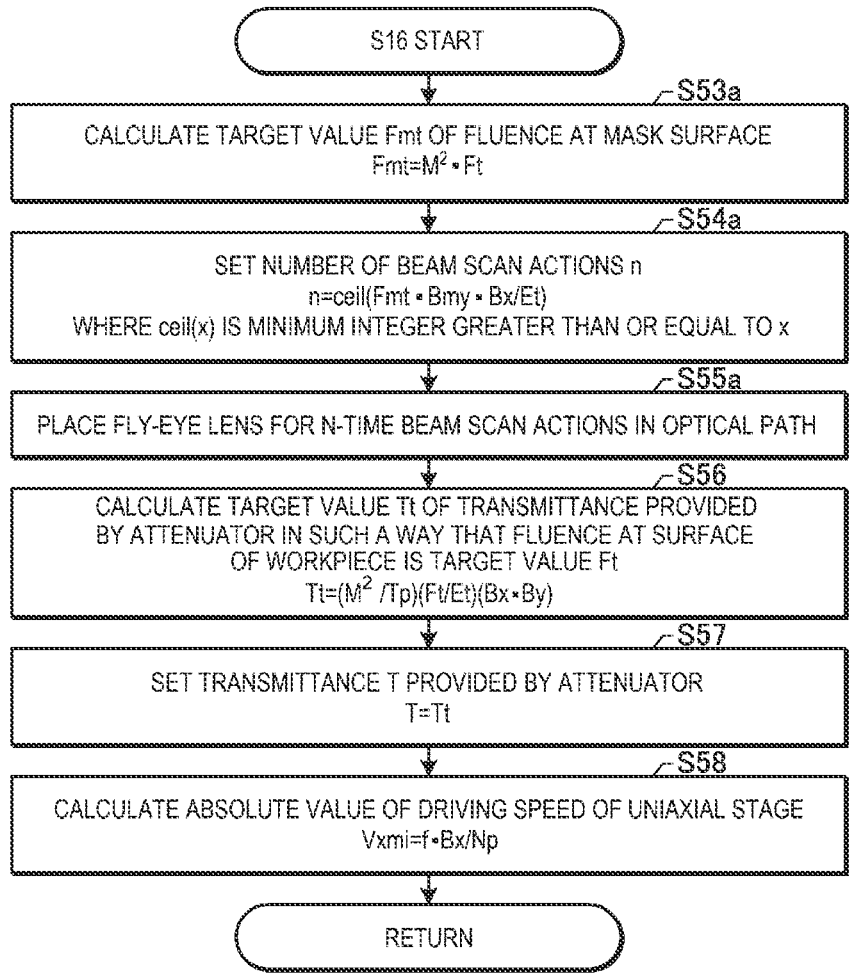
FIG. 14 is a flowchart showing an example of the content of the process of calculating and setting the control parameters for controlling the laser processing apparatus 14, the calculation and setting process carried out in the present embodiment.

FIG. 14 is a flowchart showing an example of the content of the process of calculating and setting the control parameters for controlling the laser processing apparatus 14, the calculation and setting process carried out in the present embodiment. The flowchart shown in FIG. 14 corresponds to the subroutine of step S16 in FIG. 4 and is carried out in place of the flowchart in FIG. 6 in Comparative Example described above.

In step S53a, the laser processing controller 100 calculates a target value Fmt of the fluence F at the surface of the mask 140. Since the area of the laser light irradiated region 141 of the mask 140 is $1/M^2$ times the area of the laser light irradiated region 161 of the workpiece 160, the target value Fmt of the fluence F at the surface of the mask 140 is expressed by Expression (5) below.

$$Fmt=M^2 \cdot Ft \quad (5)$$

In step S54a, the laser processing controller 100 sets the number of beam scan actions n. The number of beam scan actions n is the number of times by which the irradiated region 141 is moved within the mask 140 in the X-axis direction and the beam scan is performed. The number of beam scan actions n is a minimum integer greater than or equal to the quotient of the operation of dividing the mask width Bmy in the Y-axis direction by the radiation width By in the direction parallel to the long edges of the irradiated region 141, as shown by Expression (6) below.

$$n=\text{ceil}(Bmy/By) \quad (6)$$

In Expression (6), it is assumed that ceil(x) represents the minimum integer greater than or equal to x. The radiation width By in the direction parallel to the long edges of the irradiated region 141 varies depending on the target value Fmt of the fluence F at the surface of the mask 140.

The denominator and numerator of Bmy/By of Expression (6) are each multiplied by Fmt·Bx, resulting in Expression (7) below.

$$n=\text{ceil}(Fmt \cdot Bmy \cdot Bx/(Fmt \cdot By \cdot Bx)) \quad (7)$$

In the calculation, the denominator Fmt·By·Bx corresponds to the pulse energy at the surface of the mask 140. The pulse energy at the surface of the mask 140 roughly coincides with the target pulse energy Et. The number of beam scan actions n is therefore determined by Expression (8) below.

$$n=\text{ceil}(Fmt \cdot Bmy \cdot Bx/Et) \quad (8)$$

In step S55a, the laser processing controller 100 controls the second actuator 132b in such a way that a fly-eye lens for n-time beam scan actions is disposed in the optical path of the laser light. It is assumed that the fly-eye lens for n-time beam scan actions is a fly-eye lens that causes the radiation width By in the direction parallel to the long edges of the irradiated region 141 to fall within a predetermined range. The predetermined range of the radiation width By in the direction parallel to the long edges of the irradiated region 141 is expressed, for example, by Expression (9) below.

$$Bmy/n \leq By < Bmy/(n-1) \quad (9)$$

For example, when the number of beam scan actions n is two, the fly-eye lens for twice beam scan actions is a fly-eye lens that causes the radiation width By in the direction parallel to the long edges of the irradiated region 141 to be greater than or equal to Bmy/2 but smaller than Bmy. If such a fly-eye lens is not provided in the laser processing apparatus 14, the number of beam scan actions n is set at three. The target value Ft of the fluence F can be achieved by setting the number of beam scan actions n at three and placing the fly-eye lens for three-time beam scan actions in the optical path.

The processes in steps S56 to S58 are the same as those described with reference to FIG. 6. After step S58, the laser processing controller 100 leaves the flowchart of FIG. 14 and returns to the main procedure in FIG. 4.

2.2.3.3 Beam Scan Processing

Figure 15:
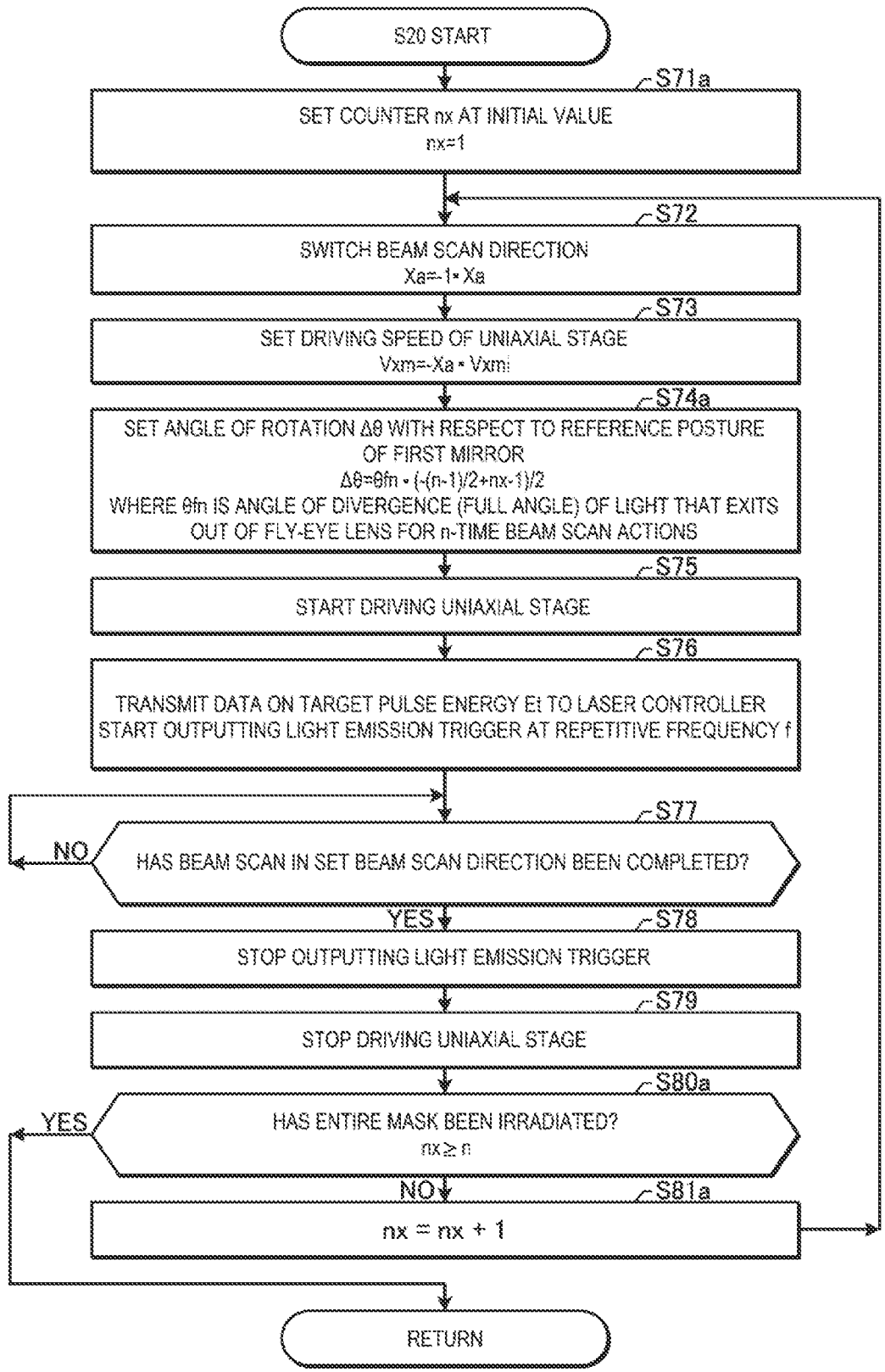
FIG. 15 is a flowchart showing an example of the content of the beam scan processing process carried out in the present embodiment.

FIG. 15 is a flowchart showing an example of the content of the beam scan processing process carried out in the present embodiment. The flowchart shown in FIG. 15 corresponds to the subroutine of step S20 in FIG. 4 and is carried out in place of the flowchart in FIG. 7 in Comparative Example described above.

In step S71a, the laser processing controller 100 sets a counter nx at an initial value of 1. The counter nx is used to count the number of beam scan actions n.

The processes in steps S72 and S73 are the same as those described with reference to FIG. 7. After step S73, the laser processing controller 100 proceeds to step S74a.

In step S74a, the laser processing controller 100 sets an angle of rotation Δθ with respect to the reference posture of the first mirror 133a by using Expression (10) below.

$$\Delta\theta = \theta fn \cdot (-(n-1)/2+nx-1)/2 \quad (10)$$

where θfn is an angle of divergence of parallelized light that exits via one surface of the fly-eye lens for n-time beam scan actions after entering the fly-eye lens for n-time beam scan action via the other surface thereof. The angle of divergence θfn is expressed in the form of a full angle.

For example, when the number of beam scan actions n is two, the value of the counter nx is one in the first beam scan action, so that the angle of rotation Δθ with respect to the reference posture is −θfn/4. Since the value of the counter nx is two in the second beam scan action, the angle of rotation Δθ with respect to the reference posture is θfn/4, which corresponds to the result of addition of θfn/2 to the angle of rotation Δθ in the first beam scan action. When the first mirror 133a is rotated by half the angle of divergence θfn, the direction of the center axis of the optical path of the laser light reflected off the first mirror 133a changes by the angle equal to the angle of divergence θfn. At this point, the distance over which the irradiated region 141 moves in the Y-axis direction is substantially equal to the radiation width By in the direction parallel to the long edges of the irradiated region 141.

The processes in steps S75 to S79 are the same as those described with reference to FIG. 7. After step S79, the laser processing controller 100 proceeds to step S80a.

In step S80a, the laser processing controller 100 evaluates whether or not the entire mask 140 has been irradiated with the laser light. Whether or not the entire mask 140 has been irradiated with the laser light is determined by evaluating whether or not n beam scan actions are completed, that is, whether or not the value of the counter nx reaches the number of beam scan actions n.

When n beam scan actions have not been completed, the result of the evaluation in step S80a is NO. When the result of the evaluation in step S80a is NO, the laser processing controller 100 proceeds to step S81a.

In step S81a, the laser processing controller 100 adds one to the value of the counter nx to update the value of the counter nx.

After step S81a, the laser processing controller 100 returns to step S72, where the laser processing controller 100 switches the beam scan direction and repeats the processes in steps S72 to S80a until the beam scan is performed n times.

When n beam scan actions have been completed, the result of the evaluation in step S80a is YES. When the result of the evaluation in step S80a is YES, the laser processing controller 100 leaves the flowchart of FIG. 15 and returns to the main procedure in FIG. 4.

The other points of the operation in the present embodiment are the same as those in Comparative Example.

2.3 Effects

According to the present embodiment, when the target value Ft of the fluence F is high, the fluence F can be increased by reducing the radiation width By in the direction parallel to the long edges of the irradiated region 141. The entire mask can be irradiated by moving the irradiated region 141 in the Y-axis direction and performing the beam scan multiple times.

In the present embodiment, the radiation width By in the direction parallel to the long edges of the irradiated region 141 is changed independently of the radiation width Bx in the direction parallel to the short edges of the irradiated region 141. A laser processing apparatus 14 having a large adjustment margin of the fluence F can thus be achieved.

In the present embodiment, the irradiated region 141 is moved in the Y-axis direction by rotating the first mirror 133a around an axis parallel to the axis X. The configuration described above allows the irradiated region 141 to be moved at high speed as compared with a configuration in which the entire beam shaping optical system 130a is moved in the Y-axis direction by the uniaxial stage 138a and a configuration in which the mask 140 and the workpiece 160 are moved in the Y-axis direction in synchronization with each other. Therefore, the irradiated region 141 can be moved in the Y-axis direction in a short period to perform the beam scan multiple times, whereby the productivity of laser processing can be improved.

In the present embodiment, the first mirror 133a is disposed between the fly-eye lens disposed in the optical path of the laser light, out of the first fly-eye lens 134a and the second fly-eye lens 134b, and the first condenser lens 136a. According to the configuration described above, when the first mirror 133a is tilted with respect to the reference posture, the center axis of the optical path of the laser light is tilted, and the laser light is caused to obliquely enter the first condenser lens 136a. The first condenser lens 136a can then cause the center axis of the optical path of the laser light tilted by the first mirror 133a to return to a direction substantially perpendicular to the surface of the mask 140.

3. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser processing apparatus comprising:
a placement base on which a workpiece is placed;
a beam shaping optical system configured to shape laser light in such a way that an irradiated region of a mask configured to block part of the laser light that is a region irradiated with the laser light has a rectangular shape having short edges and long edges,
a second radiation width of the irradiated region in a direction parallel to the long edges being changeable independently of a first radiation width of the irradiated region in a direction parallel to the short edges, and
the irradiated region being movable in the direction parallel to the long edges;
a projection optical system configured to project a pattern of the mask on the workpiece placed on the placement base; and
a mover configured to be capable of moving the irradiated region in the direction parallel to the short edges,
the beam shaping optical system including:
a first mirror disposed in an optical path of the laser light;
a first actuator configured to be capable of moving the irradiated region in the direction parallel to the long edges by changing a posture of the first mirror;
a first fly-eye lens and a second fly-eye lens having focal lengths different from each other; and
a second actuator configured to be capable of changing the second radiation width of the irradiated region by moving a holder holding both the first fly-eye lens and the second fly-eye lens to move the first fly-eye lens and the second fly-eye lens so as to switch states of the first and second fly-eye lenses between a first state in which the first fly-eye lens is placed in the optical path of the laser light and a second state in which the second fly-eye lens is placed in the optical path of the laser light.

2. The laser processing apparatus according to claim 1, wherein the beam shaping optical system further includes a first condenser lens that the laser light having passed through one of the first fly-eye lens and the second fly-eye lens enters, and
the second actuator moves the first fly-eye lens and the second fly-eye lens relatively to the first condenser lens.

3. The laser processing apparatus according to claim 2, wherein the second radiation width of the irradiated region in the first state is greater than or equal to, in the direction parallel to the long edges, a width of a patterned region in which the pattern of the mask is formed, and
the second radiation width of the irradiated region in the second state is smaller than, in the direction parallel to the long edges, the width of the patterned region in which the pattern of the mask is formed.

4. The laser processing apparatus according to claim 2, wherein the first fly-eye lens and the second fly-eye lens each have a plurality of cylindrical surfaces, and the plurality of cylindrical surfaces each have a focal axis parallel to the short edges.

5. The laser processing apparatus according to claim 4, wherein the first condenser lens has a cylindrical surface, and the cylindrical surface has a focal axis parallel to the short edges.

6. The laser processing apparatus according to claim 4, wherein the beam shaping optical system further includes a third fly-eye lens placed in the optical path of the laser light, and
the third fly-eye lens has a plurality of cylindrical surfaces, and the plurality of cylindrical surfaces each have a focal axis parallel to the long edges.

7. The laser processing apparatus according to claim 6, wherein the beam shaping optical system further includes a second condenser lens that the laser light having passed through the third fly-eye lens enters, and
the second condenser lens has a cylindrical surface, and the cylindrical surface has a focal axis parallel to the long edges.

8. The laser processing apparatus according to claim 2, wherein the first mirror is disposed between a fly-eye lens placed in the optical path of the laser light, out of the first fly-eye lens and the second fly-eye lens, and the first condenser lens.

9. The laser processing apparatus according to claim 2, wherein the beam shaping optical system further includes a third fly-eye lens placed in the optical path of the laser light, and
the first mirror is disposed between a fly-eye lens placed in the optical path of the laser light, out of the first fly-eye lens and the second fly-eye lens, and the third fly-eye lens.

10. The laser processing apparatus according to claim 2, wherein the first actuator is configured to be capable of moving the irradiated region in the direction parallel to the long edges by rotating the first mirror around an axis parallel to the short edges.

11. The laser processing apparatus according to claim 10, wherein the mover is configured to be capable of moving the irradiated region in the direction parallel to the short edges by moving the beam shaping optical system in the direction parallel to the short edges.

12. The laser processing apparatus according to claim 11, wherein the beam shaping optical system further includes a second mirror disposed in the optical path of the laser light that enters the beam shaping optical system in the direction parallel to the short edges.

13. The laser processing apparatus according to claim 12, wherein the second mirror is configured to reflect the laser light in such a way that the laser light is incident on the first mirror in the direction parallel to the long edges.

14. The laser processing apparatus according to claim 12, wherein the first fly-eye lens and the second fly-eye lens are disposed between the first mirror and the second mirror.

15. A method for processing a workpiece, the method using
a laser processing apparatus including
a placement base on which a workpiece is placed,
a beam shaping optical system configured to shape laser light in such a way that an irradiated region of a mask configured to block part of the laser light that is a region irradiated with the laser light has a rectangular shape having short edges and long edges,
a second radiation width of the irradiated region in a direction parallel to the long edges being changeable independently of a first radiation width of the irradiated region in a direction parallel to the short edges, and
the irradiated region being movable in the direction parallel to the long edges,
a projection optical system configured to project a pattern of the mask on the workpiece placed on the placement base, and
a mover configured to be capable of moving the irradiated region in the direction parallel to the short edges,
the beam shaping optical system including:
a first mirror disposed in an optical path of the laser light;
a first actuator configured to be capable of moving the irradiated region in the direction parallel to the long edges by changing a posture of the first mirror;
a first fly-eye lens and a second fly-eye lens having focal lengths different from each other; and
a second actuator configured to be capable of changing the second radiation width of the irradiated region by moving a holder holding both the first fly-eye lens and the second fly-eye lens to move the first fly-eye lens and the second fly-eye lens so as to switch states of the first and second fly-eye lenses between a first state in which the first fly-eye lens is placed in the optical path of the laser light and a second state in which the second fly-eye lens is placed in the optical path of the laser light,
the method comprising:
shaping the laser light in such a way that the irradiated region has the rectangular shape;
projecting the pattern of the mask on the workpiece placed on the placement base; and
moving the irradiated region in the direction parallel to the short edges.

16. The laser processing apparatus according to claim 1, wherein the laser light passed through the first fly-eye lens in the first state has a first optical path and the laser light passed through the second fly-eye lens in the second state has a second optical path at least partially overlapping the first optical path.

17. The laser processing apparatus according to claim 1, further comprising a controller configured to control the second actuator so as to switch the first state and the second state according to a target value of fluence of the laser light at a surface of the workpiece.

18. The laser processing apparatus according to claim 1, further comprising a controller configured to control the second actuator so as to select the first state if a target value of fluence of the laser light at a surface of the workpiece is a first value and select the second state if the target value is a second value.

* * * * *